(12) United States Patent
Yoon et al.

(10) Patent No.: US 8,198,625 B2
(45) Date of Patent: Jun. 12, 2012

(54) TRANSPARENT NONVOLATILE MEMORY THIN FILM TRANSISTOR AND METHOD OF MANUFACTURING THE SAME

(75) Inventors: Sung Min Yoon, Daejeon (KR); Shin Hyuk Yang, Yongin-si (KR); Soon Won Jung, Daejeon (KR); Seung Youl Kang, Daejeon (KR); Doo Hee Cho, Daejeon (KR); Chun Won Byun, Daejeon (KR); Chi Sun Hwang, Daejeon (KR); Byoung Gon Yu, Daejeon (KR); Kyoung Ik Cho, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 324 days.

(21) Appl. No.: 12/555,986

(22) Filed: Sep. 9, 2009

(65) Prior Publication Data

US 2010/0243994 A1    Sep. 30, 2010

(30) Foreign Application Priority Data

Mar. 26, 2009    (KR) .................. 10-2009-0026068

(51) Int. Cl.
  *H01L 35/24*    (2006.01)
(52) U.S. Cl. .................. 257/40; 257/E51.001
(58) Field of Classification Search .............. 257/40, 257/E51.001
See application file for complete search history.

(56) References Cited

U.S. PATENT DOCUMENTS

| | | | |
|---|---|---|---|
| 6,674,110 B2 | 1/2004 | Gnadinger | |
| 7,408,187 B2 | 8/2008 | Kim et al. | |
| 7,772,589 B1 * | 8/2010 | Shieh et al. | 257/43 |
| 2004/0002176 A1 | 1/2004 | Xu | |
| 2005/0077606 A1 | 4/2005 | Schmid et al. | |
| 2007/0252137 A1 | 11/2007 | Gelinck et al. | |

FOREIGN PATENT DOCUMENTS

| | | |
|---|---|---|
| JP | 2000-150900 | 5/2000 |
| JP | 2007-096129 | 4/2007 |
| JP | 2007-265481 | 10/2007 |
| KR | 1020070031165 A | 3/2007 |
| KR | 1020080065865 A | 7/2008 |
| KR | 1020080097977 A | 11/2008 |

OTHER PUBLICATIONS

Noh et al, "ZnO-based nonvolatile memory thin-film transistors with polymer dielectric/ferroelectric double gate insulators," Applied Physics Letters, 90, 253504, 2007, pp. 253504-1-253504-3.*

(Continued)

*Primary Examiner* — Anthony Ho

(57) ABSTRACT

Provided are a transparent nonvolatile memory thin film transistor (TFT) and a method of manufacturing the same. The memory TFT includes source and drain electrodes disposed on a transparent substrate. A transparent semiconductor thin layer is disposed on the source and drain electrodes and the transparent substrate interposed between the source and drain electrodes. An organic ferroelectric thin layer is disposed on the transparent semiconductor thin layer. A gate electrode is disposed on the organic ferroelectric thin layer in alignment with the transparent semiconductor thin layer. Thus, the transparent nonvolatile memory TFT employs the organic ferroelectric thin layer, the oxide semiconductor thin layer, and auxiliary insulating layers disposed above and below the organic ferroelectric thin layer, thereby enabling low-cost manufacture of a transparent nonvolatile memory device capable of a low-temperature process.

7 Claims, 13 Drawing Sheets

OTHER PUBLICATIONS

M. W. J. Prins et al., "A ferroelectric transparent thin-film transistor," Applied Physics Letters, 1996, pp. 3550-3652, vol. 68, American Institute of Physics, 1996.

Sumiko Fujisaki et al., "Low-voltage operation of ferroelectric poly(vinylidene fluoride-trifluoroethylene) copolymer capacitors and metal-ferroelectric-insulator-semiconductor diodes," Applied Physics Letters, 2007, pp. 162902-1-162902-3, vol. 90, American Institute of Physics, 2007.

Jung Won Seo et al., "Transparent resistive random access memory and its characteristics for nonvolatile resistive switching," Applied Physics Letters, 2008, vol. 93, 223505-1-223505-3, vol. 93, American Institute of Physics, 2008.

* cited by examiner

FIG. 5

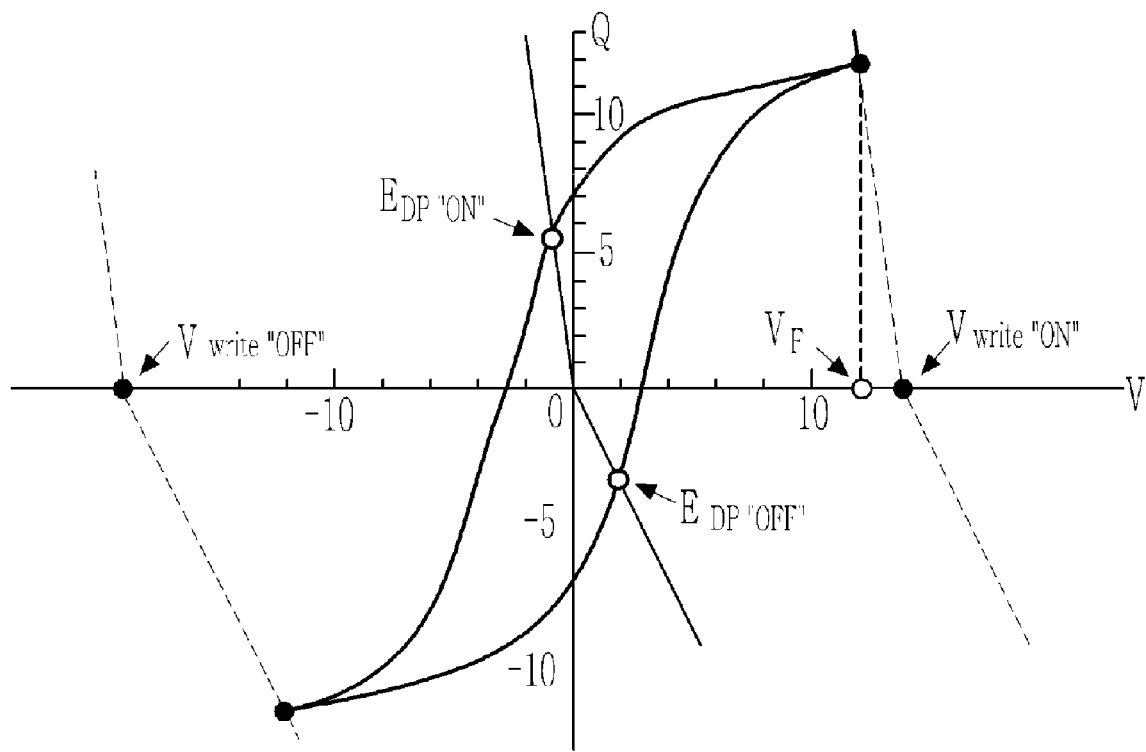

FIG. 6

| Parameter | Value |
|---|---|
| Dielecric constane of insulator(Er) | 7.6 (for $Al_2O_3$) |
| Total film thickness fo insulator (Tr) | 4nm |
| Dielecric constane of oxide semiconductor(Es) | 9.7 (for ZnO) |
| Film thickness of oxide semiconductor(Ts) | 10nm |
| Carrier concentration of oxide semiconductor (ND) | $1 \times 10^{-7}/cm^3$ |
| Dielectric constane of organic ferroelectric(Ef) | 11.4 (for PVDF) |
| Coercive field of organic ferroelectric (Ec,f) | 600 kV/cm |
| Saturation ferroelectric polarization (Ps) | 9.4 uC/cm$^2$ |
| Remnant polarization of organic ferroelectric (Pr) | 7.0 uC/cm$^2$ |

| THICKNESS OF AUXILIARY INSULATING LAYER | RELATIVE ON-OPERATION VOLTAGE | RELATIVE ON-OPERATION DEPOLARIZATION FIELD |
|---|---|---|
| 10 nm | 8.0 $V_F$ | 0.22 $E_F$ |
| 7 nm | 6.0 $V_F$ | 0.20 $E_F$ |
| 4 nm | 3.9 $V_F$ | 0.20 $E_F$ |

| PERMITTIVITY OF AUXILIARY INSULATING LAYER | RELATIVE ON-OPERATION VOLTAGE | RELATIVE ON-OPERATION DEPOLARIZATION FIELD |
|---|---|---|
| 3.9 | 6.6 $V_F$ | 0.22 $E_F$ |
| 7.5 | 3.8 $V_F$ | 0.20 $E_F$ |
| 20 | 2.0 $V_F$ | 0.17 $E_F$ |
| 50 | 1.4 $V_F$ | 0.13 $E_F$ |

| THICKNESS OF OXIDE SEMICONDUCTOR THIN LAYER | RELATIVE OFF-OPERATION VOLTAGE | RELATIVE OFF-OPERATION DEPOLARIZATION FIELD |
|---|---|---|
| 5nm | 6.6 $V_F$ | 0.20 $E_F$ |
| 10nm | 9.4 $V_F$ | 0.21 $E_F$ |
| 15nm | 12.2 $V_F$ | 0.21 $E_F$ |
| 20nm | 15.2 $V_F$ | 0.21 $E_F$ |

| CARRIER CONCENTRATION OF OXIDE SEMICONDUCTOR THIN LAYER | RELATIVE OFF-OPERATION DEPOLARIZATION FIELD |
|---|---|
| $1 \times 10^{17}/cm^3$ | $0.22\ E_F$ |
| $5 \times 10^{17}/cm^3$ | $0.22\ E_F$ |
| $1 \times 10^{18}/cm^3$ | $0.22\ E_F$ |
| $5 \times 10^{18}/cm^3$ | $0.21\ E_F$ |
| $1 \times 10^{19}/cm^3$ | $0.21\ E_F$ |
| $5 \times 10^{19}/cm^3$ | $0.20\ E_F$ |

TRANSPARENT NONVOLATILE MEMORY THIN FILM TRANSISTOR AND METHOD OF MANUFACTURING THE SAME

CROSS-REFERENCE TO RELATED APPLICATION

This application claims priority to and the benefit of Korean Patent Application No. 10-2009-0026068, filed Mar. 26, 2009, the disclosure of which is incorporated herein by reference in its entirety.

BACKGROUND

1. Field of the Invention

The present invention relates to a transparent nonvolatile memory thin film transistor (TFT), and more specifically, to a transparent nonvolatile memory TFT in which the physical properties and materials of respective components of a gate stack of the TFT are optimized to allow the TFT to be transparent in a visible light region, undergo a low-temperature process, and perform low-voltage and high-speed operations, and a method of manufacturing the TFT.

2. Discussion of Related Art

The electronics industry has been developing so far through the advancement of silicon-based materials and device technology. Electronic components of the electronics industry are composed of a large number of silicon unit devices. In order to improve performance of the components, methods for integrating a large number of elements into a small area by downscaling the elements are being employed.

Meanwhile, since 2000, the technical development of the electronics industry has taken a somewhat different direction. That is, the electronics industry has led to the coexistence of the above-described conventional silicon-based electronic technology and unprecedented new concepts.

Specifically, new fields that are introducing the new concepts have the following characteristics. First, there is a growing tendency for electronic devices and systems to be formed on flexible substrates, abandoning the conventional silicon-based electronic devices that are hard and breakable. Second, the manufacture of transparent electronic devices and systems is being favored over that of conventional silicon-based electronic devices formed on silicon substrates that are opaque in the visible light region. These two tendencies in the electronics industry are closely related not only to recent fractionalization and diversification of demands among consumers to which conventional devices have not been able to adjust, but also to the successive introduction of integrated applications including multimedia contents and the rapid increase in personal portable devices.

In addition to the demand for high-performance silicon electronic devices, new concepts of electronic devices are being required to satisfy new standards, such as low cost, disposability, portability, and inclinations toward design and health. The first new field implicated therein is flexible electronic devices in which flexible substrates are used, and the second new field is transparent electronic devices having transparent systems. In recent years, techniques in the two new fields have been rapidly developed in the academic and industrial worlds. Also, research is being conducted on developing various applications, such as sensors, displays, electronic circuits, and batteries.

In the above-mentioned field of the transparent electronic devices, the development of transparent thin film transistors (TFTs) and transparent displays using the transparent TFTs as driver circuits is accelerating and entering into a stage of increasing technical readiness and devising target applications to put the devices to practical use. Furthermore, research into techniques of disposing transparent electronic circuits on various substrates using the transparent TFTs is in progress.

Meanwhile, development of techniques related to memory devices for storing data have lagged far behind the brisk development of techniques for displaying and processing data using transparent devices. Of course, since the memory devices (or data storage devices) may be mounted outside systems to perform predetermined functions, there is not as much need for them to be transparent as there is in data display/processing devices. However, if it is possible to mount transparent nonvolatile memory devices with appropriate functions in systems, the systems may have better performance and reduce power consumption and mounting cost. As a result, introduction of systems having new functions can be expected.

A memory device for a transparent electronic system should satisfy the following requirements:

First, the memory device should be nonvolatile. In general, memory devices may be divided into volatile memories and nonvolatile memories. A volatile memory stores data only when power is supplied, while a nonvolatile memory may retain data even when power is interrupted. Since the transparent electronic system is highly likely to be a stand-alone electronic device to which power is always supplied or a design-oriented application with a highlighted mobile function, a nonvolatile data storage function is required to increase the lifespan of a battery and store a large amount of data.

Second, an operating voltage of the memory should be within a predetermined range. When a memory operation requires an excessively high operating voltage through excessive emphasis on transparency, the entire electronic system may be adversely affected, and mounting the memory device in the electronic system or an integrated circuit (IC) becomes unnecessary. In addition, the memory device should ensure stable operations within the range of an operating voltage of a module used along with the memory device.

Third, the memory device should not be excessively large. A transparent memory device for a transparent electronic system would not only store data but also serve as an embedded memory device with additional functions. Accordingly, the memory device should be as small as possible so as not to excessively increase the size of the entire system.

Fourth, the memory device should ensure device stability suitable for operations required by the transparent electronic system. A typical nonvolatile memory device should also satisfy some reliability items.

A first reliability item is a repeated write characteristic, which indicates the number of times a memory device is capable of repeating a write operation. A second reliability item is a memory retention characteristic, which indicates how long the memory device can retain stored data. A third reliability item is an environmental tolerance, which indicates the capability of retaining stored data in hot or humid environments. A transparent memory device for a transparent electronic system would not have to satisfy a high reliability characteristic equal to that of a conventional silicon electronic device, but should satisfy reliability specifications required by the corresponding application.

Although several examples of transparent nonvolatile memory devices have been reported thus far, they perform memory operations based on different principles. Three typical principles on which the reported transparent nonvolatile memory devices operate and merits and demerits of the principles will now be briefly described.

A first method of operating a transparent nonvolatile memory device employs a transparent oxide material having a relatively wide bandgap. In this method, the memory device operates on a principle that the resistance of a transparent oxide thin layer with a wide bandgap varies with application of a voltage. A memory using the first method is typically referred to as an oxide resistive memory, which has been proposed for an advanced nonvolatile memory that will supersede flash memories in the field of conventional silicon electronic devices. In order to apply an oxide resistive memory to a transparent electronic system, all elements constituting the oxide resistive memory must be formed of transparent materials. Accordingly, an oxide thin layer, which is an essential element of the oxide resistive memory, should be formed of a material with a wide bandgap, whose resistance varies within a large range according to the intensity or direction of an applied voltage. The oxide resistive memory device is structurally simple and occupies a relatively small area. However, the principle that the resistance of a material forming the oxide resistive memory device varies according to the intensity or direction of an applied voltage has not yet been closely examined, and it is known that the oxide resistive memory undergoes big differences in characteristics when materials of upper and lower electrodes are varied. In other words, it is difficult to ensure characteristic uniformity of the oxide resistive memory, and the operating principles of the oxide resistive memory are unclear. Thus, the oxide resistive memory cannot be used as an embedded memory for a system.

A second method of operating a transparent nonvolatile memory device involves preparing a charging region in a predetermined portion of a memory device so that a threshold voltage of a transistor can be varied according to the intensity or direction of an applied voltage. The charging region may correspond to a thin layer corresponding a portion of a gate of the transistor or nanodots. A memory using the second method is typically referred to as a nano-floating gate memory, which has also been developed as an advanced flash memory in the field of conventional silicon electronic devices. The manufacture of the nano-floating memory requires a relatively simple, additional process, that is, a process of forming a charging region on a portion of a gate stack of a conventional transparent TFT. However, since the nano-floating gate memory uses an oxide semiconductor thin layer, it is far more difficult to quantitatively control the storage of charges than in a case in which a silicon semiconductor layer is used. Furthermore, the drive of an oxide semiconductor thin layer using an accumulation layer and a depletion layer precludes low-voltage operations.

A third method of operating a transparent nonvolatile memory device employs a ferroelectric thin layer as a gate insulating layer of a TFT so that a threshold voltage of the TFT can be varied according to the direction of an applied voltage using a remnant polarization characteristic of the ferroelectric thin layer. A memory using the third method is typically referred to as a transistor-type ferroelectric memory, which has also been developed as an advanced nonvolatile memory in the field of conventional silicon electronic devices. Similarly, the manufacture of the transistor-type ferroelectric memory requires a relatively simple process, that is, a process of forming a ferroelectric thin layer instead of a gate insulating layer without changing the structure of a conventional transparent TFT. Also, physically predictable, exact operating principles based on the remnant polarization of a ferroelectric material may be advantageous to designing the transistor-type ferroelectric memory device. However, when the ferroelectric thin layer is formed of an oxide material, the oxide material needs to be crystallized so that its ferroelectric characteristics can be used for device operations. Since an oxide-based ferroelectric thin layer is typically crystallized at a temperature of about 500° C. or higher, the crystallization is not compatible with a process of forming a transparent oxide semiconductor layer at a temperature of about 300° C. or lower. In addition, when a ferroelectric thin layer is formed of an organic material, a large leakage current is generated and it is difficult to thin out the ferroelectric thin layer and apply the ferroelectric thin layer to memory devices.

SUMMARY OF THE INVENTION

The present invention is directed to a structure of a transparent nonvolatile memory thin film transistor (TFT) applicable to the field of transparent electronic systems and a method of manufacturing the memory TFT. The transparent nonvolatile memory TFT according to the present invention may employ an organic ferroelectric thin layer and an oxide semiconductor thin layer, reduce a process temperature, and ensure process compatibility.

Also, the present invention is directed to a stack structure of a gate insulating layer of a transparent nonvolatile memory TFT applicable to a transparent electronic system, which may reduce an operating voltage and improve operating reliability, and a method of manufacturing the gate insulating layer.

One aspect of the present invention provides a transparent nonvolatile memory TFT including: source and drain electrodes disposed on a transparent substrate; a transparent semiconductor thin layer disposed on the source and drain electrodes and the transparent substrate interposed between the source and drain electrodes; an organic ferroelectric thin layer disposed on the transparent semiconductor thin layer; and a gate electrode disposed on the organic ferroelectric thin layer in alignment with the transparent semiconductor thin layer.

The memory TFT may further include a first auxiliary insulating layer disposed on the transparent semiconductor thin layer.

The memory TFT may further include a second auxiliary insulating layer disposed on the organic ferroelectric thin layer.

The source and drain electrodes may be formed of a transparent conductive oxide.

The transparent semiconductor thin layer may be a transparent oxide semiconductor thin layer.

The oxide semiconductor thin layer may be formed of at least two selected from the group consisting of zinc oxide (ZnO), indium-gallium-zinc oxide (In—Ga—Zn—O), zinc-tin oxide (Zn—Sn—O), and an oxide containing at least two selected from the group consisting of zinc (Zn), indium (In), gallium (Ga), tin (Sn), and aluminum (Al).

The organic ferroelectric thin layer may be formed of a copolymer of poly(vinylidene fluoride-trifluorotethylene) (P(VDF-TrFE)).

The organic ferroelectric thin layer may include a via hole exposing the source and drain electrodes. In this case, the memory TFT may further include a pad disposed on the organic ferroelectric thin layer to fill the via hole.

The first auxiliary insulating layer or the second auxiliary insulating layer may be one selected from the group consisting of a silicon-based insulating layer, a metal oxide layer, and a silicate insulating layer formed of a metal element constituting the metal oxide layer and silicon. In this case, the silicon-based insulating layer may be one selected from the group consisting of a silicon oxide ($SiO_2$) layer, a silicon nitride (SiN) layer, and a silicon oxynitride (SiON) layer, and the metal oxide layer may be one selected from the group consisting of an aluminum oxide ($Al_2O_3$) layer, a hafnium oxide ($HfO_2$) layer, a zirconium oxide ($ZrO_2$) layer, a magnesium oxide (MgO) layer, a titanium oxide ($TiO_2$) layer, a tantalum oxide ($Ta_2O_5$) layer, a lanthanum oxide ($La_2O_3$) layer, and a strontium-titanium oxide ($SrTiO_3$) layer.

Another aspect of the present invention provides a method of manufacturing a transparent nonvolatile memory TFT. The method includes: forming source and drain electrodes on a transparent substrate; forming a transparent semiconductor thin layer on a portion of the source and drain electrodes and the transparent substrate interposed between the source and drain electrodes; forming an organic ferroelectric thin layer on the transparent semiconductor thin layer; and forming a gate electrode on the organic ferroelectric thin layer in alignment with the transparent semiconductor thin layer.

The method may further include: forming a first auxiliary insulating layer on the transparent semiconductor thin layer; and patterning the first auxiliary insulating layer and the transparent semiconductor thin layer to define a gate region.

The method may further include: forming a second auxiliary insulating layer on the organic ferroelectric thin layer; and forming a via hole in the second auxiliary insulating layer and the organic ferroelectric thin layer to expose the source and drain electrodes.

The source and drain electrodes may be formed of a transparent conductive oxide.

The transparent semiconductor thin layer may be formed of a transparent oxide semiconductor.

The transparent semiconductor thin layer may be formed to a thickness of about 5 to 20 nm.

The organic ferroelectric thin layer may be formed of a copolymer of P(VDF-TrFE).

The organic ferroelectric thin layer may be formed using a spin coating process.

The organic ferroelectric thin layer may be crystallized at a temperature of about 120 to 200° C.

The organic ferroelectric thin layer may be formed to a thickness of about 20 to 200 nm.

The sum of thicknesses of the first and second auxiliary insulating layers may range from about 3 to 10 nm.

The first and second auxiliary insulating layers may be formed to have a relative permittivity of about 20 or higher.

BRIEF DESCRIPTION OF THE DRAWINGS

The above and other features and advantages of the present invention will become more apparent to those of ordinary skill in the art by describing in detail exemplary embodiments thereof with reference to the attached drawings in which:

FIG. 5 is a schematic diagram showing an operating point of a memory TFT according to an exemplary embodiment of the present invention using a load line;

FIG. 6 is a table showing device parameters used for analysis of the load line of a transparent memory TFT according to an exemplary embodiment of the present invention;

DETAILED DESCRIPTION OF EMBODIMENTS

Figure 1:
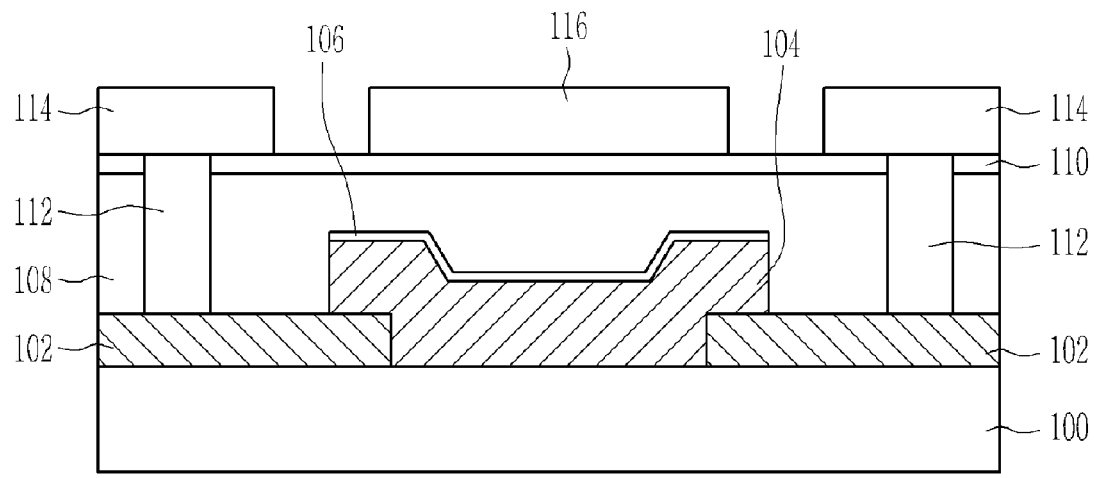
FIG. 1 is a cross-sectional view of a transparent nonvolatile memory thin film transistor (TFT) according to an exemplary embodiment of the present invention.

The present invention will be described more fully hereinafter with reference to the accompanying drawings, in which exemplary embodiments of the invention are shown. This invention may, however, be embodied in many different forms and should not be construed as being limited to the embodiments set forth herein. Rather, these embodiments are provided so that this disclosure is thorough and complete and fully conveys the concept of the invention to those skilled in the art. In the drawings, portions irrelevant to a description of the invention are omitted for brevity, and like numbers refer to like elements throughout.

It will be understood that the terms "comprises," "comprising," "has," "having," "includes," "including" and/or variations thereof, when used in this specification, specify the presence of stated features, regions, steps, operations, elements, and/or components, but do not preclude the presence or addition of one or more other features, regions, steps, operations, elements, components, and/or groups thereof.

The present invention provides a thin film transistor (TFT) including a ferroelectric gate insulating layer.

Specifically, the present invention provides an optimum structure of a transparent nonvolatile memory device, which includes an oxide semiconductor TFT using a ferroelectric gate insulating layer as a basic structure and is appropriate for a transparent electronic system, and a method of manufacturing the TFT.

In order to ensure transparency and stable operating characteristics of a nonvolatile memory device, the following technical issues must be solved.

First, a process temperature should be sufficiently reduced during manufacture of the nonvolatile memory device. Transparent electronic systems employ glass substrates or transparent plastic substrates. However, if the glass substrates and the plastic substrates are deformed due to an excessively high temperature, they cannot function as substrates. Accordingly, the entire manufacturing process should be carried out below a temperature that the glass substrate or the plastic substrate can withstand. When a nonvolatile memory device employs a ferroelectric thin layer as a gate insulating layer, especially, when an oxide ferroelectric thin layer is used as the gate insulating layer, as described above, a predetermined process cannot be performed on either a plastic substrate or a glass substrate due to a high crystallization temperature. Although this depends on a device structure, the electrical properties of a transparent conductive oxide and an oxide semiconductor, which form a TFT, are also changed at a high temperature. Thus, when an excessively high temperature is needed for a ferroelectric thin layer to be crystallized, it may be difficult to ensure the operating characteristics of the TFT. In order to solve this problem, a gate insulating layer used for a memory operation may be formed of an oxide ferroelectric material, which may undergo a crystallization process at a temperature that a substrate material or other materials forming the TFT can withstand, or an organic ferroelectric material that is crystallized at a relatively low temperature.

Second, process compatibility should be ensured. The manufacture of a transistor according to the present invention involves a lithography process for forming patterns. The lithography process employs various pattern forming chemicals, such as photoresist, a resist developer, and a resist stripper. In some cases, the manufacture of the transistor may require a process of partially removing or patterning a thin layer using plasma. During the entire manufacturing process of a memory transistor, ensuring appropriate process conditions for preventing process degradation according to the material of a ferroelectric thin layer is imperative.

Third, the operating voltage of the nonvolatile memory device should be reduced. It is now reported that a memory device including an organic ferroelectric gate insulating layer exhibits a very high operating voltage characteristic irrespective of the kind of semiconductor material.

For this reason, the following three points should be considered.

First, when an organic ferroelectric layer has a small thickness, an excessively large leakage current may be generated and the organic ferroelectric layer may be unable to act as an insulating layer or to exhibit a memory operating characteristic. Accordingly, in most cases, the thickness of the organic ferroelectric layer is increased. This results in a rise in a voltage to be applied to the organic ferroelectric thin layer in order to reveal a ferroelectric characteristic, thereby increasing the entire operating voltage of a device.

Second, in the case of poly(vinylidene fluoride-trifluorotethylene) (P(VDF-TrFE)), which is an organic ferroelectric material, a coercive field required for polarization reversal, which is a ferroelectric characteristic, is even higher than that of a ferroelectric thin layer so that repetition of on and off operations requires a relatively high voltage.

Third, when an oxide semiconductor is adapted to a transparent nonvolatile memory device, since the oxide semiconductor operates in an accumulation layer and a depletion layer, its operating voltage required for memory operations tends to increase higher than the operating voltage of a conventional silicon-based transistor operating in an accumulation layer and an inversion layer.

A fourth technical issue to be solved to embody the transparent nonvolatile memory TFT according to the present invention is to design a device structure having improved operating reliability. As stated above, a nonvolatile memory device should satisfy several operating reliability items. Among these, it is known that a transistor-type ferroelectric memory device has a very poor memory retention characteristic. The reason for which the transistor-type ferroelectric memory device has a poor memory retention characteristic will be described in detail later with reference to drawings. Since the memory retention characteristic actually determines the lifespan of the nonvolatile memory device, accurately designing the structure of the nonvolatile memory device according to the kind and usage of a transparent electronic system is imperative. Fortunately, by effectively utilizing the operating principles of the nonvolatile memory device using a ferroelectric gate insulating layer according to the present invention as described, design principles that can extend a memory retention time as long as possible may be ensured. This method is significant in putting the transparent nonvolatile memory device according to the present invention to practical use. Furthermore, in view of analogous devices reported so far, in many cases, it is difficult to ascertain if the characteristics of the analogous devices result from the remnant polarization of a ferroelectric thin layer. Accordingly, it is very important to ensure exact design principles in consideration of device stability and confirm compatibility with the operating characteristics of a device to be manufactured.

Therefore, the present invention provides a transparent nonvolatile memory TFT, which employs an organic ferroelectric thin layer as a gate insulating layer and a transparent oxide semiconductor thin layer as a semiconductor layer so as to undergo a low-temperature process and enable low-voltage, highly reliable operations.

As a result, the following two points may be considered to embody a transparent nonvolatile memory device and a method of manufacturing the same according to the present invention.

First, an appropriate combination of an organic ferroelectric material and an oxide semiconductor material should be selected so that a transparent nonvolatile memory TFT according to the present invention can include an organic ferroelectric thin layer and an oxide semiconductor thin layer and undergo a low-temperature process. Also, it is necessary to establish a method of manufacturing a transparent nonvolatile memory device according to the present invention not to damage the organic ferroelectric thin layer during the processing of the organic ferroelectric thin layer and the formation of an upper electrode. Accordingly, P(VDF-TrFE) may be used as the organic ferroelectric material, and an ultrathin inorganic auxiliary insulating layer may be formed on the organic ferroelectric thin layer.

Second, when the transparent nonvolatile memory TFT according to the present invention employs the organic ferroelectric thin layer and the oxide semiconductor thin layer as a gate insulating layer and a semiconductor layer, respectively, it should be designed to enable low-voltage, highly reliable operations. In order to reduce the thickness of the organic ferroelectric thin layer to reduce an effective applied voltage, and also prevent generation of an excessive leakage current in the entire gate stack, an auxiliary insulating layer capable of preventing the generation of a leakage current may be formed within such a range as not to excessively increase an operating voltage. Furthermore, the operating voltage and memory retention characteristic of the transparent nonvolatile memory TFT according to the present invention greatly depend on the thicknesses, permittivities, and other electrical properties of respective elements of the gate stack. Thus, in order to enable low-voltage, highly reliable operations, the ultrathin inorganic auxiliary insulating layer may be formed on the oxide semiconductor thin layer, and the thickness and permittivities of the auxiliary insulating layer and the thickness and carrier concentration of the oxide semiconductor thin layer may be appropriately controlled.

Hereinafter, the structure of a transparent nonvolatile memory TFT and a method of manufacturing the same will be described in detail with reference to FIGS. 1 and 2.

FIG. 1 is a cross-sectional view of a transparent nonvolatile memory TFT according to an exemplary embodiment of the present invention, and FIGS. 2A through 2I are cross-sectional views illustrating a process of manufacturing a transparent nonvolatile memory TFT according to an exemplary embodiment of the present invention.

Referring to FIG. 1, a transparent nonvolatile memory TFT according to the present invention may include a substrate 100, source and drain electrodes 102, an oxide semiconductor thin layer 104, a first auxiliary insulating layer 106, an organic ferroelectric thin layer 108, a second auxiliary insulating layer 110, via holes 112, source and drain electrode pads 114, and a gate electrode 116.

The substrate 100 may be a glass substrate or a plastic substrate to ensure the transparency of a memory device.

The source and drain electrodes 102 may be disposed on the substrate 100. The source and drain electrodes 102 may be formed of a transparent conductive oxide, for example, indium-tin oxide (ITO). However, the source and drain electrodes 102 may be formed of any other conductive oxide having a sufficiently low resistance and a high transparency. The source and drain electrodes 102 may be respectively disposed on two electrically separated regions of the substrate 100, and the width of patterns of the source and drain electrodes 102 and a distance between the patterns of the source and drain electrodes 102 may be respectively defined as the channel width and channel length of the transparent nonvolatile memory TFT according to the present invention.

The oxide semiconductor thin layer 104 may be disposed on the source and drain electrodes 102 and the substrate 100 interposed between the patterned source and drain electrodes 102. The oxide semiconductor thin layer 104 may function as a semiconductor layer of the transparent nonvolatile memory TFT according to the present invention.

The oxide semiconductor thin layer 104 may be formed of one of various oxide materials, which are transparent due to a wide bandgap and have semiconductor characteristics. For example, the oxide semiconductor thin layer 104 may be formed of zinc oxide (ZnO), indium-gallium-zinc oxide (In—Ga—Zn—O), or zinc-tin oxide (Zn—Sn—O). Alternatively, the oxide semiconductor thin layer 140 may be formed of an oxide containing at least two selected from the group consisting of zinc (Zn), indium (In), gallium (Ga), tin (Sn), and aluminum (Al). In some cases, the oxide semiconductor thin layer 104 may be formed of one of the above-described oxide materials into which various elements are doped.

The first auxiliary insulating layer 106 may be disposed on the oxide semiconductor thin layer 104. The functions of the first auxiliary insulating layer 106 will now be described.

First, the first auxiliary insulating layer 106 may inhibit degradation of the oxide semiconductor thin layer 104 during subsequent processes of patterning the oxide semiconductor thin layer 104 and removing an etch mask. That is, in order to realize the transparent nonvolatile memory TFT according to the present invention, the first auxiliary insulating layer 106 may be used to ensure good operating characteristics of the oxide semiconductor thin layer 104 that functions as the semiconductor layer. Second, the first auxiliary insulating layer 106 may serve as an electrical buffer layer to effectively control a leakage current element of the organic ferroelectric insulating layer 108 that will be formed later. As described above, it is known that as an organic ferroelectric thin layer is made thinner, a leakage current becomes larger. This characteristic greatly threatens the operating characteristics of the transparent nonvolatile memory TFT according to the present invention. Accordingly, it is very important to prepare a method of effectively controlling a leakage current of the organic ferroelectric insulating layer. Therefore, the present invention provides the first auxiliary insulating layer 106 interposed between the subsequent organic ferroelectric thin layer 108 and the oxide semiconductor thin layer 104 in order to prevent generation of a leakage current.

The first auxiliary insulating layer 106 may be, for example, a silicon-based insulating layer, a metal oxide layer, or a silicate insulating layer formed of a metal element forming the metal oxide layer and silicon. Here, the silicon-based insulating layer may be a silicon oxide ($SiO_2$) layer, a silicon nitride (SiN) layer, or a silicon oxynitride (SiON) layer. Also, the metal oxide layer may be an aluminum oxide ($Al_2O_3$) layer, a hafnium oxide ($HfO_2$) layer, a zirconium oxide ($ZrO_2$) layer, a magnesium oxide (MgO) layer, a titanium oxide ($TiO_2$) layer, a tantalum oxide ($Ta_2O_5$) layer, a lanthanum oxide ($La_2O_3$) layer, or a strontium-titanium oxide ($SrTiO_3$) layer. Alternatively, the first auxiliary insulating layer 106 may be formed of any material forming a gate insulating layer of a conventional TFT.

However, when selecting a material forming the first auxiliary insulating layer 106, the following three points may be considered.

First, the first auxiliary insulating layer 106 may be formed of a material that may sufficiently inhibit degradation during the etching of the oxide semiconductor thin layer 104. Second, the first auxiliary insulating layer 106 may be formed of a material having a sufficient electrical insulation characteristic to inhibit generation of a leakage current of the subsequent organic ferroelectric thin layer 108 after the etching of the oxide semiconductor thin layer 104. Third, the first auxiliary insulating layer 106 may be formed of a material that may minimize a rise in an operating voltage of the transparent nonvolatile memory TFT according to the present invention. The cause of the rise in the operating voltage of the transparent nonvolatile memory TFT according to the present invention due to the introduction of the first auxiliary insulating layer 106 and the physical properties of materials required to prevent the rise in the operating voltage will be described later in further detail with reference to FIGS. 5, 7, and 8.

The thickness of the first auxiliary insulating layer 106 may be selected in consideration of the following two points. First, the first auxiliary insulating layer 106 should have a sufficient thickness not to interfere with the process degradation inhibition effect during the etching of the oxide semiconductor thin layer 104. Also, the first auxiliary insulating layer 106 should have a sufficient thickness to inhibit generation of a leakage current of the organic ferroelectric thin layer 108. Second, the thickness of the first auxiliary insulating layer 106 should be controlled not to excessively increase the operating voltage of the transparent nonvolatile memory TFT according to the present invention. A variation in the operating voltage of the TFT relative to the thickness of the first auxiliary insulating layer 106 and the range of a desired thickness of the first auxiliary insulating layer 106, which significantly affect the structural characteristics of the TFT according to the present invention, will be described later in further detail with reference to FIG. 7.

The first auxiliary insulating layer 106 and the oxide semiconductor thin layer 104 may be disposed on a gate channel between the source and drain electrodes 102 using a patterning process.

The organic ferroelectric thin layer 108 may be disposed on the patterned first auxiliary insulating layer 106 and the source and drain electrodes 102. The organic ferroelectric thin layer 108 may be formed of an organic material, more specifically, a monomer or polymer organic material. In particular, the organic ferroelectric thin layer 108 may be formed of a ferroelectric material that exhibits remnant polarization with application of a voltage.

For example, the organic ferroelectric thin layer 108 may be formed of P(VDF-TrFE), which is a copolymer obtained by mixing poly(vinylidene fluoride) (P(VDF)) with Trifluorotethylene (TrFE) in an appropriate ratio. The mixture ratio of P(VDF) with TrFE may be controlled to be within such a range for P(VDF-TrFE) as to exhibit a ferroelectric characteristic. Typically, P(VDF-TrFE) may be formed of at least 55% by weight P(VDF). Meanwhile, the mixture ratio may be appropriately controlled to optimize the leakage current and ferroelectric characteristics of the organic ferroelectric thin layer 108.

The thickness of the organic ferroelectric thin layer 108 should be selected in consideration of the following two points. First, the organic ferroelectric thin layer 108 may have such a thickness as to reduce the operating voltage of the transparent nonvolatile memory TFT. Thus, the organic ferroelectric thin layer 108 may have as small a thickness as possible such that polarization reversal easily occurs even at a relatively low applied voltage. Second, the organic ferroelectric thin layer 108 may have such a thickness as to improve the data retention characteristic of the transparent nonvolatile memory TFT. Since a memory retention time is closely related to the leakage current characteristic of the organic ferroelectric thin layer 108, the thickness of the organic ferroelectric thin layer 108 should be optimized to prevent generation of an excessive leakage current during operation of the device. Accordingly, the thickness of the organic ferroelectric thin layer 108 may be selected within an appropriate range in consideration of the above-described two points.

The second auxiliary insulating layer 110 may be disposed on the organic ferroelectric thin layer 108. The functions of the second auxiliary insulating layer 110 will now be described. First, like the first auxiliary insulting layer 106, the second auxiliary insulating layer 110 may serve as an electrical buffer layer to effectively control a leakage current element of the organic ferroelectric insulating layer 108. In this case, the electrical buffer layer is prepared to inhibit the leakage current element for the same reason as described above in relation with the functions of the first auxiliary insulating layer 106. Second, after forming the organic ferroelectric thin layer 108, the second auxiliary insulating layer 110 may protect the organic ferroelectric thin layer 108 during the patterning of a portion of the organic ferroelectric thin layer 108 or the formation of the source and drain electrode pads 114 and the gate electrode 116 on the organic ferroelectric thin layer 108. Since the organic ferroelectric thin layer 108 is formed of an organic material, it may be very liable to mechanical damage. Also, the organic ferroelectric thin layer 108 lacks a tolerance to some chemicals used during a device manufacturing process and is likely to lose its intrinsic characteristics during various plasma processes. Accordingly, in order to overcome the above-described drawbacks and ensure stable operations of the transparent nonvolatile memory TFT according to the present invention, the second auxiliary insulating layer 110 may be disposed on the organic ferroelectric thin layer 108.

The second auxiliary insulating layer 110 may be formed of the same material as the first auxiliary insulating layer 104. For example, the second auxiliary insulating layer 110 may be a silicon-based insulating layer, a metal oxide layer, or a silicate insulating layer formed of a metal element forming the metal oxide layer and silicon. Here, the silicon-based insulating layer may be a silicon oxide ($SiO_2$) layer, a silicon nitride (SiN) layer, or a silicon oxynitride (SiON) layer. Also, the metal oxide layer may be an aluminum oxide ($Al_2O_3$) layer, a hafnium oxide ($HfO_2$) layer, a zirconium oxide ($ZrO_2$) layer, a magnesium oxide (MgO) layer, a titanium oxide ($TiO_2$) layer, a tantalum oxide ($Ta_2O_5$) layer, a lanthanum oxide ($La_2O_3$) layer, or a strontium-titanium oxide ($SrTiO_3$) layer.

Materials forming the second auxiliary insulating layer 110 may be selected in consideration of the following three points. First, the second auxiliary insulating layer 110 may be formed of a material that may sufficiently prevent suffering from various process degradations due to the presence of the organic ferroelectric thin layer 108. Second, process conditions under which the second auxiliary insulating layer 110 is formed should not adversely affect the electrical and mechanical characteristics of the underlying organic ferroelectric thin layer 108. Third, like the first auxiliary insulating layer 106, the second auxiliary insulating layer 110 may be formed of a material that may minimize a rise in an operating voltage of the transparent nonvolatile memory TFT according to the present invention. The cause of the rise in the operating voltage of the transparent nonvolatile memory TFT according to the present invention due to the introduction of the second auxiliary insulating layer 110 and the physical properties of materials required to prevent the rise in the operating voltage will be described later in further detail with reference to FIGS. 5, 7, and 8.

The thickness of the second auxiliary insulating layer 110 may be selected in consideration of the following two points. First, the second auxiliary insulating layer 110 should have a sufficient thickness not to interfere with the effect of inhibiting the organic ferroelectric thin layer 108 from suffering from process degradation during a subsequent process. Second, the thickness of the second auxiliary insulating layer 110 should be controlled not to excessively increase the operating voltage of the transparent nonvolatile memory TFT according to the present invention.

As a result, when the transparent nonvolatile memory TFT according to the present invention includes both the first and second auxiliary insulating layers 106 and 110, the two elements may be replaced by a single element on analysis of the operations of the transparent nonvolatile memory TFT according to the present invention. Also, the sum and variations of the thicknesses of the first and second auxiliary insulating layers 106 and 110 may significantly affect the operating voltage of the transparent nonvolatile memory TFT according to the present invention. Accordingly, the ranges of thicknesses of the first and second auxiliary insulating layers 106 and 110 will be described later in further detail with reference to FIG. 7.

Via holes 112 may be disposed in portions of the second auxiliary insulating layer 110 and the organic ferroelectric thin layer 108. The via holes 112 may be used to form the electrode pads 114, which are electrically connected to the source and drain electrodes 102 by interconnection lines.

The source and drain electrode pads 114 may fill the via holes 112 and be electrically connected to the source and drain electrodes 102, respectively. The source and drain electrode pads 114 may be formed of a transparent conductive oxide, for example, indium-tin oxide (ITO). However, the source and drain electrode pads 114 may be formed of a conductive oxide having a sufficiently low resistance and a high transparency.

The gate electrode 116 may be disposed on a portion of the second auxiliary insulating layer 110 corresponding to a gate channel of the memory TFT according to the present invention, on which the oxide semiconductor thin layer 104 is disposed. The gate electrode 116 may be formed of a transparent conductive oxide, for example, ITO. However, the gate electrode 116 may be formed of any other conductive oxide having a sufficiently low resistance and a high transparency. In addition, the source and drain electrode pads 114 and the gate electrode 116 may be disposed at the same level on the second auxiliary insulating layer 110.

The above-described structure of the transparent nonvolatile memory TFT shown in FIG. 1 may be partially changed to improve the characteristics of a memory device, and a transparent nonvolatile memory TFT that can be manufactured according to the method of the present invention is not limited to the above-described structure.

Hereinafter, a method of manufacturing a transparent nonvolatile memory TFT according to the present invention will be described in more detail with reference to FIGS. 2A through 2I.

Figure 2A:
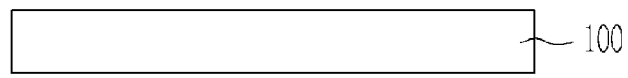
FIGS. 2A through 2I are cross-sectional views illustrating a process of manufacturing a transparent nonvolatile memory TFT according to an exemplary embodiment of the present invention.

Referring to FIG. 2A, a substrate 100 may be provided. The substrate 100 may be a glass substrate or plastic substrate in order to ensure the transparency of a device according to the present invention. When the substrate 100 is a plastic substrate, an appropriate pretreatment process may be carried out to improve the surface flatness of the substrate 110.

Figure 2B:
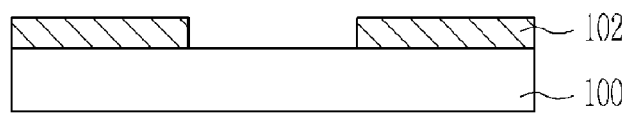

Referring to FIG. 2B, source and drain electrodes 102 may be formed on the substrate 100. The source and drain electrodes 102 may be formed of a transparent oxide material, for example, ITO, which exhibits a high conductivity and a high transparency. The formation of the source and drain electrodes 102 may be performed using a conventional thin film forming process, for example, a sputtering process, which enables formation of a transparent oxide conductive thin layer. The source and drain electrodes 102 may be formed to a thickness of about 50 to 150 nm, but the present invention is not limited thereto. The source and drain electrodes 102, which are formed of a thin layer on the entire surface of the substrate 100, may be patterned to be spaced a predetermined distance apart from each other in order to form a source, drain, and gate channel of the transparent nonvolatile memory TFT according to the present invention. The patterning of the source and drain electrodes 102 may be performed using wet and dry etching processes. The width and length of a region interposed between the patterned source and drain electrodes 102 may correspond to the width and length of the channel of the TFT according to the present invention. In an exemplary embodiment of the present invention, the source and drain electrodes 102 were formed of ITO to a thickness of about 150 nm on the glass substrate 100 and patterned by wet etching using a predetermined etchant to form the patterned source and drain electrodes 102.

Figure 2C:
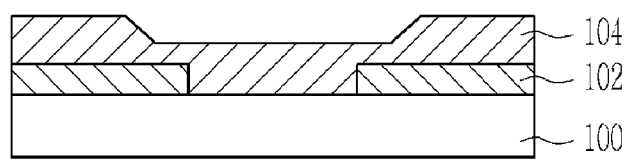

Referring to FIG. 2C, an oxide semiconductor thin layer 104 functioning as a semiconductor layer of the TFT according to the present invention may be formed on the source and drain electrodes 102. As described above, the oxide semiconductor thin layer 104 may be formed of one of various oxide materials, which are transparent due to a wide bandgap and have semiconductor characteristics.

The formation of the oxide semiconductor thin layer 104 may be performed using one of various thin film forming processes, for example, an atomic layer deposition (ALD) process, a chemical vapor deposition (CVD) process, and a reactive sputtering process, which are applied to an ordinary semiconductor manufacturing process. Typically, the oxide semiconductor thin layer 104 may be formed to a thickness of about 5 to 30 nm. However, the range of the thickness of the oxide semiconductor thin layer 104 needs to be strictly determined because it significantly affects the operating conditions of the transparent nonvolatile memory TFT according to the present invention. The influence of a variation in the thickness of the oxide semiconductor thin layer 104 on the operating characteristics of the transparent nonvolatile memory TFT according to the present invention will be described later in further detail with reference to FIGS. 5 and 9. In an exemplary embodiment of the present invention, the oxide semiconductor thin layer 104 was formed of zinc-tin oxide(Zn—Sn—O) to a thickness of about 25 nm using a sputtering process.

Figure 2D:
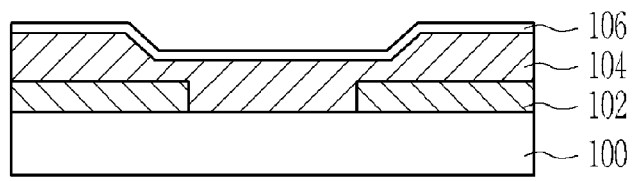

Referring to FIG. 2D, a first auxiliary insulating layer 106 may be formed on the oxide semiconductor thin layer 104. The principles that guide the functions and material selection of the first auxiliary insulating layer 106 are the same as described above in detail with reference to FIG. 1. The memory TFT structure including the first auxiliary insulating layer 106 is a feature of the present invention. Meanwhile, the formation of the first auxiliary insulating layer 106 may be performed using one of various thin film forming processes that are applied to an ordinary semiconductor manufacturing process. More preferably, though not necessarily, process conditions under which the first auxiliary insulating layer 106 is formed may be determined within such ranges as not to degrade the characteristics of the underlying oxide semiconductor thin layer 104. Here, a process temperature, the use or disuse of plasma, and a thin film forming material should be considered as the process conditions. As described above, since the thickness of the first auxiliary insulating layer 106, along with the thickness of a second auxiliary insulating layer 110 that will be formed later, may greatly affect the operating characteristics of the transparent nonvolatile memory TFT according to the present invention, this will be described later in further detail with reference to FIGS. 5, 7, and 8. In an exemplary embodiment of the present invention, the first auxiliary insulating layer 106 was formed of aluminum oxide ($Al_2O_3$) to a thickness of about 9 nm using an ALD process. In this case, the $Al_2O_3$ first auxiliary insulating layer 106 was formed at a temperature of about 200° C.

Figure 2E:
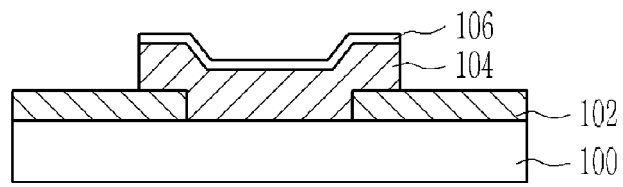

Referring to FIG. 2E, the oxide semiconductor thin layer 104 and the first auxiliary insulating layer 106 may be batch-patterned to form a gate region of the transparent nonvolatile memory TFT according to the present invention. This patterning process may be performed using a photolithography process that is applied to an ordinary semiconductor manufacturing process. Also, the oxide semiconductor thin layer 104 and the first auxiliary insulating layer 106 may be etched by a wet etching process using a predetermined wet etchant and a dry etching process using a predetermined dry etch gas and plasma. In any process, the first auxiliary insulating layer 106 may effectively inhibit the oxide semiconductor thin layer 104 from suffering from process degradation. In an exemplary embodiment of the present invention, a stacked structure of the oxide semiconductor thin layer 104 and the first auxiliary insulating layer 106 was patterned using ordinary photolithography and wet etching processes, thereby forming the gate region of the transparent nonvolatile memory TFT according to the present invention.

Figure 2F:
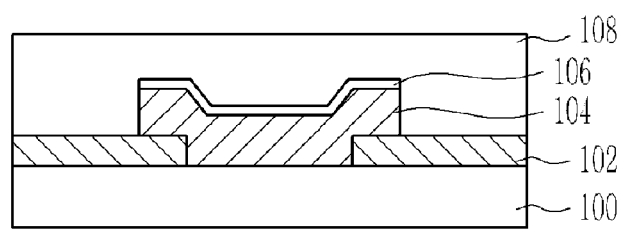

Referring to FIG. 2F, an organic ferroelectric thin layer 108 may be formed on the patterned first auxiliary insulating layer 106 and source and drain electrodes 102. The formation of the organic ferroelectric thin layer 108 may be performed using, for example, a spin coating process. In this case, the thickness of the organic ferroelectric thin layer 108 may be controlled by adjusting spin-coating speed (i.e., revolutions per minute (RPM)) and the concentration of an organic ferroelectric raw material solution. In order to form the organic ferroelectric thin layer 108 using a spin coating process, an organic ferroelectric raw material solution should be prepared before anything else. When the organic ferroelectric thin layer 108 is formed using P(VDF-TrFE), which is a typical organic ferroelectric material, an organic ferroelectric raw material solution may be prepared by dissolving solid grains of P(VDF-TrFE) in an appropriate organic solvent. The formation of the organic ferroelectric thin layer 108 using a spin coating process involves the following process operations. First, drops of a raw material solution may be added onto a predetermined substrate so that the substrate may be coated with the raw material solution under appropriate spin-coating conditions. Second, a first thermal treatment may be performed at a predetermined temperature to volatilize an organic solvent contained in the raw material solution. Third, a second thermal treatment may be performed at a predetermined temperature to crystallize the formed organic ferroelectric thin layer 108. Normally, a temperature at which the first thermal treatment is performed may range from about 50 to 100° C., although this depends on the kind of organic ferroelectric material. Also, although a temperature at which the second thermal treatment is performed depends on the kind of organic ferroelectric material, when P(VDF-TrFE) is used as an organic ferroelectric material, the second thermal treatment may be performed at a temperature of about 120 to 200° C. Since the crystallization of the organic ferroelectric thin layer 108 is necessarily required to obtain good ferroelectric characteristics, it is very important to select an appropriate crystallization temperature. When the crystallization temperature is excessively low, the organic ferroelectric thin layer 108 cannot obtain desired electrical characteristics due to its insufficient crystallinity. Conversely, when the crystallization temperature is excessively high, the formed organic ferroelectric thin layer 108 may completely melt and lose its ferroelectric characteristics. In an exemplary embodiment of the present invention, the organic ferroelectric thin layer 108 may be formed of P(VDF-TrFE) to a thickness of about 100 nm using a spin coating process and crystallized at a temperature of about 140° C.

Figure 2G:
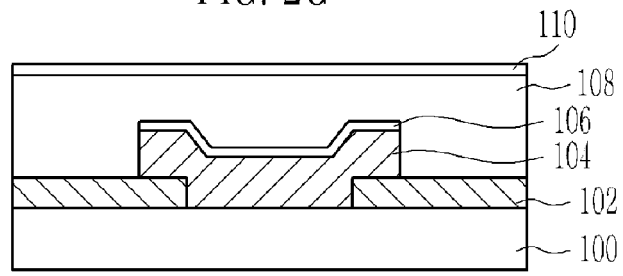

Referring to FIG. 2G, a second auxiliary insulating layer 110 may be formed on the organic ferroelectric thin layer 108.

The principles that guide the functions and material selection of the second auxiliary insulating layer 110 are the same as described above in detail with reference to FIG. 1. The memory TFT structure including the second auxiliary insulating layer 110 is a feature of the present invention. Meanwhile, the formation of the second auxiliary insulating layer 110 may be performed using one of various thin film forming processes that are applied to an ordinary semiconductor manufacturing process. More preferably, though not necessarily, process conditions under which the second auxiliary insulating layer 110 is formed may be determined within such ranges as not to degrade the characteristics of the underlying organic ferroelectric thin layer 108. Here, a process temperature, the use or disuse of plasma, and a thin film forming material should be considered as the process conditions. In particular, it is known that the organic ferroelectric thin layer 108 is very vulnerable to a plasma process. Thus, the second auxiliary insulating layer 110 may be formed without using plasma. Accordingly, the formation of the second auxiliary insulating layer 110 using a reactive sputtering process may be avoided because it is highly likely to damage the organic ferroelectric thin layer 108. As described above, since the thickness of the second auxiliary insulating layer 110, along with the thickness of the first auxiliary insulating layer 106, may greatly affect the operating characteristics of the transparent nonvolatile memory TFT according to the present invention, this will be described later in further detail with reference to FIGS. 5, 7, and 8.

Figure 2H:
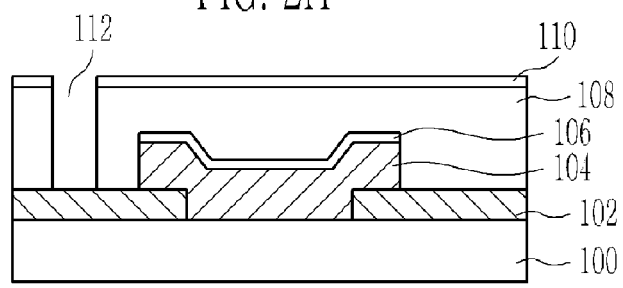

Referring to FIG. 2H, via holes 112 may be formed in portions of the second auxiliary insulating layer 110 and the organic ferroelectric thin layer 108 to expose the source and drain electrodes 102. The via holes 112 may be used to electrically connect source and drain electrode pads 114, which are formed on the second auxiliary insulating layer 110, with the source and drain electrodes 102. The formation of the via holes 112 may involve patterning the second auxiliary insulating layer 110 and the organic ferroelectric thin layer 108 using an ordinary photolithography process, performing a wet etching process using a predetermined etchant, and performing a dry etching process using a predetermined etchant gas. A process of forming the via holes 112 according to an exemplary embodiment of the present invention will now be described in detail. A predetermined hole pattern may be formed in an oxide insulating material forming the second auxiliary insulating layer 110 using a wet etching process or a dry etching process depending on the kind of the oxide insulating material. However, when the organic ferroelectric thin layer 108 is patterned using an exclusive etchant containing an organic solvent, the organic ferroelectric thin layer 108 may be wholly delaminated due to its very high etch rate and isotropic etching characteristics, and it is highly likely that the predetermined via hole 112 shown in FIG. 2H may be unsuccessfully formed. Meanwhile, since the organic ferroelectric thin layer 108 is easily removed due to $O_2$ plasma, a region of the organic ferroelectric thin layer 108 corresponding to the via hole 112 may be effectively removed by applying $O_2$ plasma using an ordinary dry etching apparatus under appropriate conditions. Meanwhile, since the second auxiliary insulating layer 110 has a very small thickness, a region of the second auxiliary insulating layer 110 corresponding to the via hole 112 may be removed at the same time using a blanket dry etching process. Accordingly, a method of manufacturing a transparent nonvolatile memory TFT according to the present invention may include partially removing the organic ferroelectric thin layer 108 by a dry etching process using $O_2$ plasma.

Figure 2I:
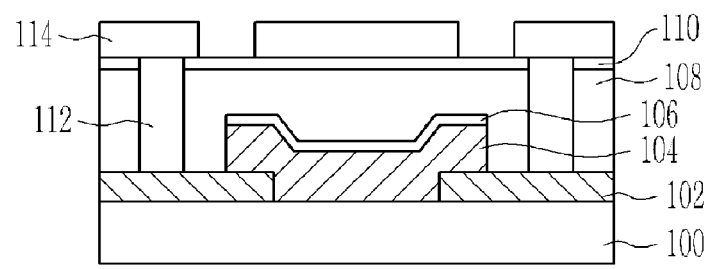

Referring to FIG. 2I, source and drain electrode pads 114 may be formed on the second auxiliary insulating layer 110 to fill the via holes 112 and be electrically connected to the source and drain electrodes 102, respectively. Also, a gate electrode 116 may be formed on a portion of the second auxiliary insulating layer 110 corresponding to a gate channel in alignment with the oxide semiconductor thin layer 104.

The source and drain electrode pads 114 and the gate electrode 116 may be formed of a transparent conductive oxide, for example, ITO, but they may be formed of any other conductive oxide having a sufficiently low resistance and a high transparency. In this case, ITO, which is a typical transparent conductive oxide, may be deposited using an ordinary sputtering process. However, as described above, since the organic ferroelectric thin layer 108 is very vulnerable to a plasma process, it may suffer from serious process degradation in a device structure excluding the second auxiliary insulating layer 110. Accordingly, in order to provide a method of manufacturing a memory TFT according to the present invention without performing a process of forming the second auxiliary insulating layer 110, much care must be taken to form the gate electrode 116.

Although the structure of a transparent nonvolatile memory TFT and a method of manufacturing the same according to the present invention are described with reference to FIGS. 1 and 2, it is necessary to optimize the structural characteristics of the memory TFT by precisely making an analysis of the operations of the memory TFT in order to ensure stable operating characteristics of the memory TFT.

Hereinafter, in order to ensure better operating characteristics of the transparent nonvolatile memory TFT including the oxide semiconductor thin layer 104 functioning as a semiconductor layer, the organic ferroelectric thin layer 108 functioning as a gate insulating layer, and the first and second auxiliary insulating layers 106 and 110 disposed above and below the organic ferroelectric thin layer 108, the physical properties of respective elements of the memory TFT and methods of determining the ranges of thicknesses thereof will be described in detail.

Figure 3:
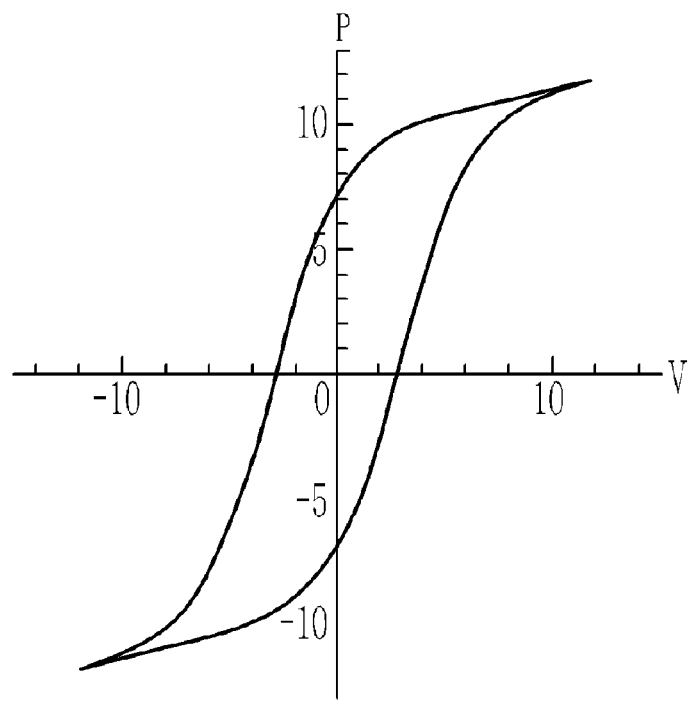
FIG. 3 is a graph showing polarization-voltage (P-V) characteristics of an organic ferroelectric thin layer of a memory TFT according to an exemplary embodiment of the present invention.

FIG. 3 is a graph showing polarization-voltage (P-V) characteristics of an organic ferroelectric thin layer of a memory TFT according to an exemplary embodiment of the present invention.

Referring to FIG. 3, when the organic ferroelectric thin layer 108 is formed of P(VDF-TrFE) obtained by mixing P(VDF) with TrFE in a ratio of 70:30, an actual metal-ferroelectric-metal (MFM) capacitor may be formed and the electrical characteristics of the MFM capacitor may be measured, so that the electrical physical characteristics of the organic ferroelectric thin layer 108 can be obtained. Meanwhile, the P-V characteristics shown in FIG. 3 may be provided in order to make an operating point analysis of the memory TFT according to the present invention. Thus, the P-V characteristics shown in FIG. 3 may be obtained by actual measurements and calculations of the MFM capacitor using a Miller's model proposed by the preceding research.

In order to obtain a P-V curve of FIG. 3, the organic ferroelectric thin layer 108 had a coercive field (Ec) of about 600 kV/cm, a saturation ferroelectric polarization (Ps) of about 9.4 $\mu C/cm^2$, and a remnant ferroelectric polarization (Pr) of about 7.0 $\mu C/cm^2$.

Figure 4:
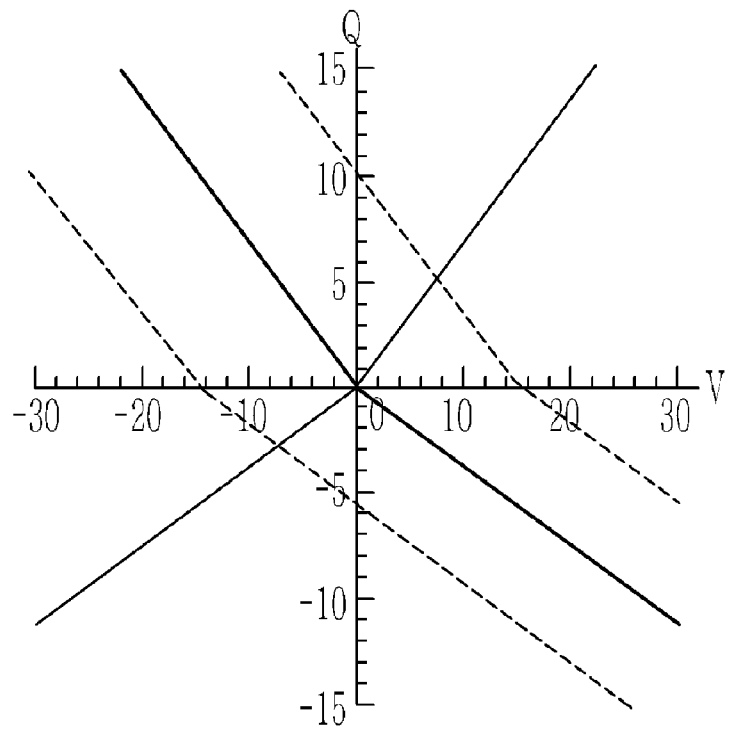
FIG. 4 is a schematic diagram showing charge amount-voltage (Q-V) characteristics of an oxide semiconductor thin layer, a first auxiliary insulating layer, and a second auxiliary insulating layer that constitute a memory TFT according to an exemplary embodiment of the present invention.

FIG. 4 is a schematic diagram showing charge amount-voltage (Q-V) characteristics of an oxide semiconductor thin layer, a first auxiliary insulating layer, and a second auxiliary insulating layer that constitute a memory TFT according to an exemplary embodiment of the present invention.

Referring to FIG. 4, a solid line that passes through the origin of the coordinates is a curve of Q-V characteristics exhibited by a synthetic capacitor including the oxide semiconductor thin layer 104, the first auxiliary insulating layer 106, and the second auxiliary insulating layer 110 with respect to an applied voltage. The Q-V curve is provided to make an operating point analysis of the memory TFT according to the present invention. The Q-V curve is determined as shown in FIG. 4 for the following reasons.

The Q-V curve may be obtained from a variation in behavior of a synthetic capacitor relative to an applied voltage range. First, when an applied voltage is higher than 0 V, since the oxide semiconductor thin layer 104 used in a typical TFT has n-type conductivity, the oxide semiconductor thin layer 104 may operate in an accumulation layer. When the oxide semiconductor thin layer 104 having p-type conductivity is used as a semiconductor layer of a memory TFT according to the present invention, since another analysis method is required, this case will not be described in detail here. When the oxide semiconductor thin layer 104 operates in the accumulation layer, a sufficient amount of charges may be present in the surface of the oxide semiconductor thin layer 104 so that a synthetic capacitor having the Q-V curve may be composed of only the first and second auxiliary insulating layers 106 and 110. Hereinafter, for brevity, the first range is defined as a first applied voltage range. Second, when an applied voltage is between 0 V and a predetermined threshold voltage Vfd, the applied voltage becomes negative and the oxide semiconductor thin layer having n-type conductivity starts to operate in a depletion layer. In this case, the thickness of the depletion layer may be given by a function of the applied voltage and tend to widen with application of the applied voltage. Accordingly, the synthetic capacitor having the Q-V curve may include a synthetic capacitor element obtained by synthesizing a capacitor having the first and second auxiliary insulating layers 106 and 110 with a depletion-layer capacitor having the oxide semiconductor thin layer 104. The second range may be defined as a second applied voltage range. In this case, the lowest limit of the second applied voltage range is restricted to the predetermined threshold voltage greatly because the oxide semiconductor thin layer 104 used as a semiconductor layer of a TFT has a relatively small thickness of about 5 to 30 nm as described above. Specifically, when the oxide semiconductor thin layer 104 having a small thickness of about 5 to 30 nm serves as a semiconductor layer of a TFT according to the present invention, in a case in which a predetermined voltage or higher is applied, the entire thickness of the oxide semiconductor thin layer 104 may be completely depleted. However, when a semiconductor thin layer is the oxide semiconductor thin layer 104 having a sufficiently great thickness or is formed of a typical silicon material instead of an oxide semiconductor with a wide bandgap, the entire semiconductor thin layer may not be completely depleted. This is because even if a predetermined voltage or higher is applied to the oxide semiconductor thin layer 104, an inversion layer due to minority carriers does not occur. Accordingly, in the second applied voltage range, the predetermined threshold voltage Vfd may be defined as a voltage range within which the entire thickness of the oxide semiconductor thin layer 104 is completely depleted. Third, when an applied voltage is lower than the threshold voltage Vfd, the thickness of the depletion layer is no longer given by the function of the applied voltage. Also, since the thickness of the depletion layer is determined by the thickness of the oxide semiconductor thin layer 104, the synthetic capacitor having the Q-V curve may include a synthetic capacitor element obtained by synthesizing a capacitor having the first and second auxiliary insulating layers 106 and 110 with a depletion-layer capacitor having the oxide semiconductor thin layer 104. The third range may be defined as a third applied voltage range. As a result, since a slope element of the Q-V curve within the third applied voltage range is indicated by the synthetic capacitor including the depletion-layer capacitor, it is smaller than a slope element of the Q-V curve within the first applied voltage range.

As explained above, a transparent nonvolatile memory TFT according to the present invention is characterized by a variation in the slope of the Q-V curve according to the applied voltage range because the oxide semiconductor thin layer 104 is used as a semiconductor layer of the memory TFT according to the present invention. The variation in the slope of the Q-V curve according to the applied voltage range may significantly affect the operating voltage and reliability of the memory TFT.

Referring to FIG. 4, the Q-V curve of the capacitor element including the depletion layer of the oxide semiconductor thin layer 104 and the first and second auxiliary insulating layers 106 and 110 is obtained due to the fact that the Q-V curve acts as a load line determining an operating point of the memory TFT according to the present invention. A gate stack of the memory TFT according to the present invention may be regarded as a serial connection structure of a capacitor including the organic ferroelectric thin layer 108 (or ferroelectric capacitor) and a capacitor including other elements (or remaining element capacitor). Accordingly, the meaning of the load line will now be described using Equations 1, 2, and 3:

$$Q_o(Q) = C_o \times V_o \quad (1),$$

$$V_{tot} = V_o + V_F \quad (2),$$

$$Q = C_o(V_{tot} - V_F) \quad (3),$$

where $Q_o$, $C_o$, and $V_o$ denote the charge amount, capacitance, and applied voltage, respectively, of the remaining capacitor element that is connected in series to the ferroelectric capacitor, VF denotes a voltage applied to the ferroelectric capacitor, and $V_{tot}$ denotes the total voltage applied to the entire gate stack. Here, when an abscissa is given by a function of a predetermined voltage VF instead of the total voltage $V_{tot}$ in Equation 3, the total voltage $V_{tot}$ required to apply the predetermined voltage VF to the ferroelectric capacitor may be obtained. As a result, a Q-V curve, which is obtained with respect to a VF-axis, corresponds to the load line determining the operating point of the memory TFT according to the present invention. Accordingly, the load line may be illustrated with a wavy line passing through the origin of the coordinates of FIG. 4.

FIG. 5 is a schematic diagram showing an operating point of a memory TFT according to an exemplary embodiment of the present invention using a load line.

Referring to FIG. 5, it is determined that the operating point of the memory TFT according to the present invention is a point of intersection between the P-V curve of the organic ferroelectric capacitor shown in FIG. 3 and the load line obtained from the Q-V curve including the remaining capacitor element other than the organic ferroelectric capacitor element, which constitutes the gate stack, as shown in FIG. 4.

The load line may move about the VF-axis according to the applied voltage range. When the applied voltage VF to be applied to the ferroelectric capacitor is determined, the total applied voltage $V_{tot}$ to be applied to the entire gate stack may be determined.

The analysis of the load line shown in FIG. 5 is essential to the manufacture of the transparent nonvolatile memory TFT according to the present invention for the following reasons.

First, on analysis of the load line, the operating voltage of the transparent nonvolatile memory TFT according to the present invention may be optimized. A process of determining the operating voltage of the memory TFT by analysis of the load line will now be described. Assuming that a saturation hysteresis curve of the organic ferroelectric thin layer 108 is used to ensure the stable memory operating characteristics of the memory TFT, a memory on operation of the TFT involves aligning the polarization of the organic ferroelectric thin layer 108 completely in one direction by applying a voltage even to a terminal point of hysteresis of the organic ferroelectric thin layer 108. Under the above-described condition, an on-operation voltage $V_{write\text{``}ON\text{''}}$ of the actual memory TFT may correspond to a voltage obtained when a voltage axis meets the load line moving in the direction of the voltage axis so as to allow the P-V curve of the organic ferroelectric capacitor to intersect the load line in a plus applied voltage range.

On analysis of the load line, it is obvious that an on-operation voltage may decrease as the slope of the load line increases. Similarly, a memory off operation of the TFT may involve aligning the polarization of the organic ferroelectric thin layer 108 completely in the other direction by applying a reverse voltage even to an opposite terminal point of the hysteresis of the organic ferroelectric thin layer 108. Under the above-described condition, an off-operation voltage $V_{write\text{``}OFF\text{''}}$ of the actual memory TFT may correspond to a voltage obtained when the voltage axis meets the load line moving in the direction of the voltage axis so as to allow the P-V curve of the organic ferroelectric capacitor to intersect the load line in a negative applied voltage range.

On analysis of the load line, it is obvious that an off-operation voltage also may decrease as the slope of the load line increases.

In this case, as described above with reference to FIG. 4, the slope of the load line of the memory TFT according to the present invention varies according to the applied voltage range. As a necessary consequence, the absolute value of the on-operation voltage may become higher than that of the off-operation voltage. This means that an off operation may be more disadvantageous than an on operation in terms of an operating voltage of the memory TFT. In other words, it can be seen that the reduction of the operating voltage of the memory TFT according to the present invention necessitates dropping an off-operation voltage.

Second, the operating reliability of the transparent nonvolatile memory TFT according to the present invention may be optimized by analysis of the load line. Above all, the memory TFT requires optimizing a memory retention characteristic that indicates how long the memory TFT can retain stored data. However, in the case of a transistor-type ferroelectric memory according to the present invention that performs a memory operation by controlling a drain current of the TFT using a difference in remnant polarization of the organic ferroelectric thin layer 108, even if all elements are of good quality, completely retaining stored data becomes very difficult due to a depolarization field that inevitably occurs in the gate stack. The reason for which the depolarization field occurs in the memory TFT according to the present invention can also be easily understood by analysis of the load line. Referring to FIG. 5, after predetermined data is stored in the memory TFT by applying an on- or off-operation voltage, when power supply is interrupted to restore a gate voltage to 0 V, the load line of the memory TFT passes through the origin of the coordinates and intersects the P-V curve of the organic ferroelectric capacitor at two points. In this case, the two intersection points function as operating points of the memory TFT during a memory retention operation. When an on operation is followed by the memory retention operation, an electrical field equivalent to an on-operation depolarization field $E_{DP\text{-}ON\text{-}}$ is generated in the gate stack. Similarly, when an off operation is followed by the memory retention operation, an electrical field equivalent to an off-operation depolarization field $E_{DP\text{-}OFF\text{-}}$ is generated in the gate stack. The depolarization field serves to restore continuously stored memory to its original state and becomes a conclusive factor that leads to the loss of stored data with the passage of time. Therefore, the structure of the memory TFT according to the present invention may be designed to minimize the depolarization field so that the memory TFT can have a good memory retention characteristic.

On analysis of the load line of FIG. 5, it can be seen that as the slope of the load line increases, the depolarization field decreases. Noticeably, since the slope of the load line of the memory TFT according to the present invention varies according to the applied voltage range as described above, an off-operation depolarization field becomes greater than an on-operation depolarization field. As a result, during a memory operation of the memory TFT, the off operation may be more disadvantageous than the on operation in terms of a memory retention characteristic.

FIG. 6 is a table showing device parameters used for analysis of the load line of a transparent memory TFT according to an exemplary embodiment of the present invention.

A method of analyzing the operating point of the memory TFT according to the present invention using the schematic load line was described above with reference to FIGS. 3 through 5. FIG. 6 shows the physical values of respective elements of the memory TFT according to the present invention, which are used for analysis and calculation of the load line, in order to more fully describe the influence of the physical properties and thicknesses of the respective elements on the behavior of the operating point of the memory TFT. The values shown in FIG. 6 are only provided according to one of various exemplary embodiments of the present invention, and the present invention is not limited thereto.

An analysis of the load line of the memory TFT according to the present invention will be made using the device parameters shown in FIG. 6 on the following assumption.

Initially, as described above, it is assumed that the memory TFT according to the present invention performs a memory operation using a saturation hysteresis P-V curve obtained by completely saturating the polarization of the organic ferroelectric capacitor. This means that the strictest condition is assumed to estimate the operating voltage of the memory TFT according to the present invention. This is due to an empirical fact that the best memory operating characteristics can be ensured when the memory operation is performed using complete saturation hysteresis. Practically, even if the complete saturation hysteresis P-V curve is not used, a memory storage operation is enabled using partial polarization reversal. However, this case will be not described in the present specification.

Next, the memory TFT according to the present invention is characterized by including the first and second auxiliary insulating layers 106 and 110. Also, the first and second auxiliary insulating layers 106 and 110 may be formed of different materials according to circumstances. However, it is assumed for brevity that the first and second auxiliary insulating layers 106 and 110 may be formed of the same material. In other words, in the current analysis of the load line of the memory TFT, it is assumed that the memory TFT includes a single auxiliary insulating layer.

Referring to FIG. 6, an oxide semiconductor thin layer used for the analysis of the load line was formed of zinc oxide (ZnO) to a thickness of about 10 nm and had a carrier concentration of $1\times10^{17}/cm^3$. Also, the first and second auxiliary insulating layers 106 and 110, which were assumed to be the single auxiliary insulating layer, were formed of aluminum oxide ($Al_2O_3$) to a total thickness of about 4 nm.

Figure 7A:
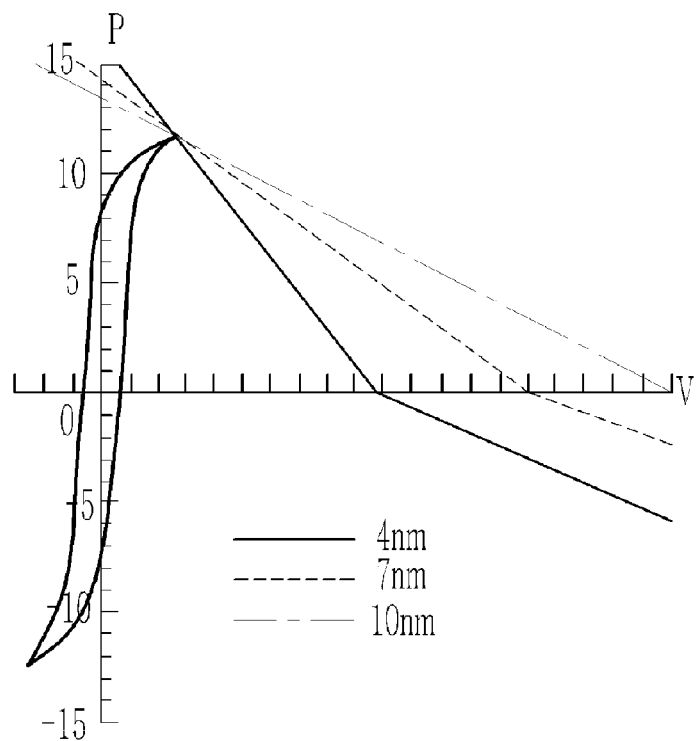
FIGS. 7A through 7C are graphs and a table showing relative operating voltages and depolarization fields of a transparent nonvolatile memory TFT according to the present invention, which are calculated by the analysis of a load line, with respect to a total thickness of first and second auxiliary insulating layers that are assumed to be a single auxiliary insulating layer.
Figure 7B:
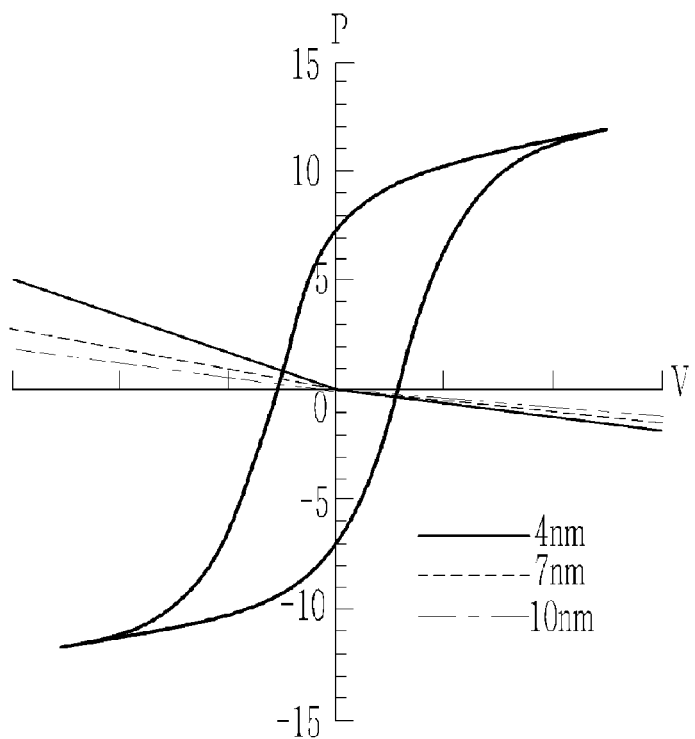
Figures 7C, 8A:
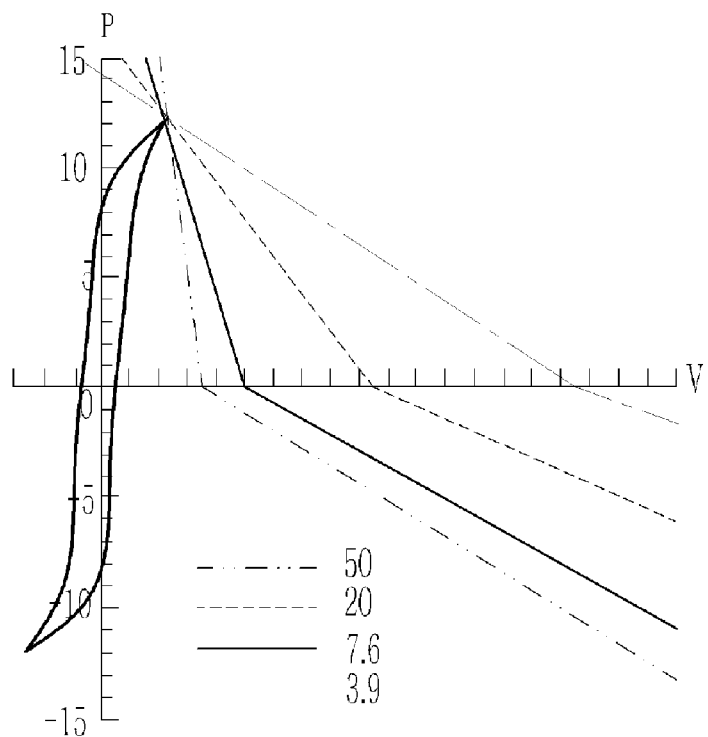
FIGS. 8A through 8C are graphs and a table showing relative operating voltages and depolarization fields of a transparent nonvolatile memory TFT according to the present invention, which are calculated by the analysis of a load line, with respect to a relative permittivity of first and second auxiliary insulating layers that are assumed to be a single auxiliary insulating layer.

FIGS. 7A through 7C are graphs and a table showing relative operating voltages and depolarization fields of a transparent nonvolatile memory TFT according to the present invention, which are calculated by the analysis of a load line, with respect to the total thickness of the first and second auxiliary insulating layers that are assumed to be the single auxiliary insulating layer.

Referring to FIGS. 7A and 7C, when the total thickness of the first and second auxiliary insulating layers 106 and 110 was changed, an on-operation voltage was indicated on the basis of a voltage VF applied to the ferroelectric capacitor. It can be seen that when the total thickness was changed to 10 nm, 7 nm, and 4 nm, a required operating voltage was changed to 8.0 VF, 6.0 VF, and 3.9 VF, respectively. That is, in order to reduce an operating voltage of the memory TFT according to the present invention, the total thickness of the first and second auxiliary insulating layers 106 and 110 needs to be as small as possible within such a range as not to damage the functions of the first and second auxiliary insulating layers 106 and 110. However, even when the first and second auxiliary insulating layers 106 and 110 had a sufficiently small thickness of about 4 nm, a considerable operating voltage was still required. This result suggests that a variation in the total thickness of the first and second auxiliary insulating layers 106 and 110 should be made simultaneously with optimization of other conditions in order to sufficiently reduce the operating voltage of the memory TFT according to the present invention.

Referring to FIGS. 7B and 7C, when the total thickness of the first and second auxiliary insulating layers 106 and 110 was changed, an on-operation depolarization field was indicated on the basis of a coercive field EF applied to the ferroelectric capacitor. It can be seen that when the total thickness was changed to 10 nm, 7 nm, and 4 nm, a depolarization field was changed to 0.22 EF, 0.22 EF, and 0.20 EF, respectively. It is true that as the total thickness of the first and second auxiliary insulating layers 106 and 110 decreases, the on-operation depolarization field also decreases. However, it can be seen that the total thickness of the first and second auxiliary insulating layers 106 and 110 did not greatly affect the on-operation depolarization field.

In the current analysis of the load line, assuming that the first and second auxiliary insulating layers 106 and 110 are a single layer, when the total thickness of the first and second auxiliary insulating layers 106 and 110 is changed, the on-operation voltage and the on-operation depolarization field were confirmed by calculation. However, it can be confirmed that an off-operation voltage and an off-operation depolarization field are less sensitive to a variation in the total thickness because of the characteristics of the load line determined by the memory TFT according to the present invention. This is due to the fact that the depletion-layer capacitor including the oxide semiconductor thin layer 104 is dominant over the capacitor including the first and second auxiliary insulating layers 106 and 110 in a synthetic capacitance of the load line in the third applied voltage range (V<Vfd).

Figures 8B, 8C:
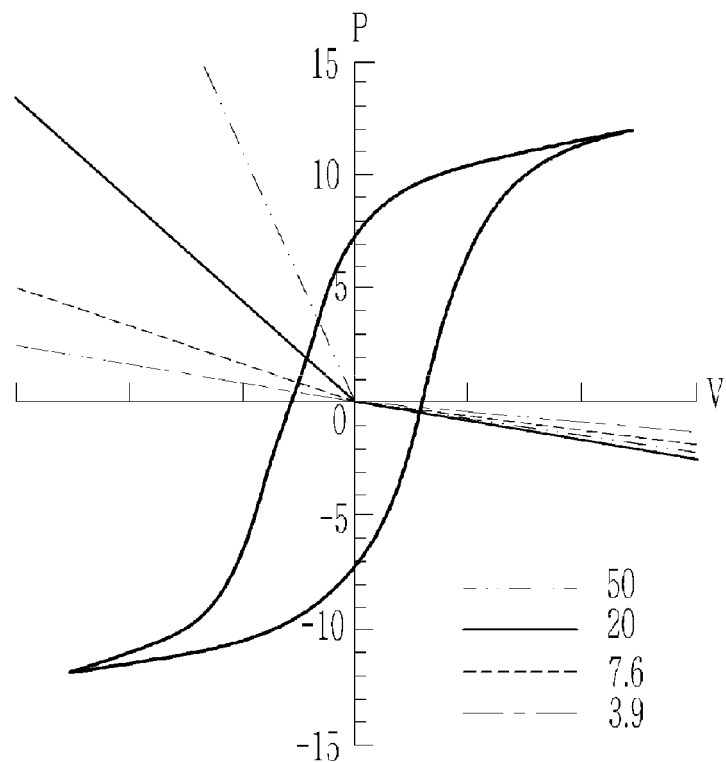

FIGS. 8A through 8C are graphs and a table showing relative operating voltages and depolarization fields of a transparent nonvolatile memory TFT according to the present invention, which are calculated by the analysis of a load line, with respect to a relative permittivity of the first and second auxiliary insulating layers that are assumed to be the single auxiliary insulating layer.

Referring to FIGS. 8A and 8C, when the relative permittivity of the first and second auxiliary insulating layers 106 and 110 was changed by varying a material thereof, an on-operation voltage was indicated on the basis of the voltage VF applied to the ferroelectric capacitor. When the relative permittivity of the first and second auxiliary insulating layers 106 and 110 was changed to 3.9, 7.6, 20, and 50, a required operating voltage was changed to 6.6 VF, 3.8 VF, 2.0 VF, and 1.4 VF, respectively. That is, in order to reduce an operating voltage of the memory TFT according to the present invention, the first and second auxiliary insulating layers 106 and 110 need to be formed of a high-k dielectric material having a high relative permittivity. As long as the first and second auxiliary insulating layers 106 and 110 are formed of a high-k dielectric material having a relative permittivity of about 50 or higher, an operating voltage required for the entire device operation may be as low as a voltage applied to the ferroelectric capacitor Referring to FIGS. 8B and 8C, when the relative permittivity of the first and second auxiliary insulating layers 106 and 110 was changed by varying a material thereof, an on-operation depolarization field was indicated on the basis of the coercive field EF applied to the ferroelectric capacitor. When the relative permittivity of the first and second auxiliary insulating layers 106 and 110 was changed to 3.9, 7.6, 20, and 50, an on-operation depolarization field was changed to 0.22 EF, 0.20 EF, 0.17 EF, and 0.13 EF, respectively. That is, by forming the first and second auxiliary insulating layers 106 and 110 using a high-k dielectric material, the depolarization field may also be greatly reduced.

In the current analysis of the load line, assuming that the first and second auxiliary insulating layers 106 and 110 are a single layer, when the relative permittivity of the first and second auxiliary insulating layers 106 and 110 is changed by varying a material thereof, the on-operation voltage and the on-operation depolarization field were confirmed by calculation. However, it can be confirmed that an off-operation voltage and an off-operation depolarization field are less sensitive to a variation in the total thickness because of the characteristics of the load line determined by the memory TFT according to the present invention. This is for the same reason as described above with reference to FIG. 7.

Figure 9A:
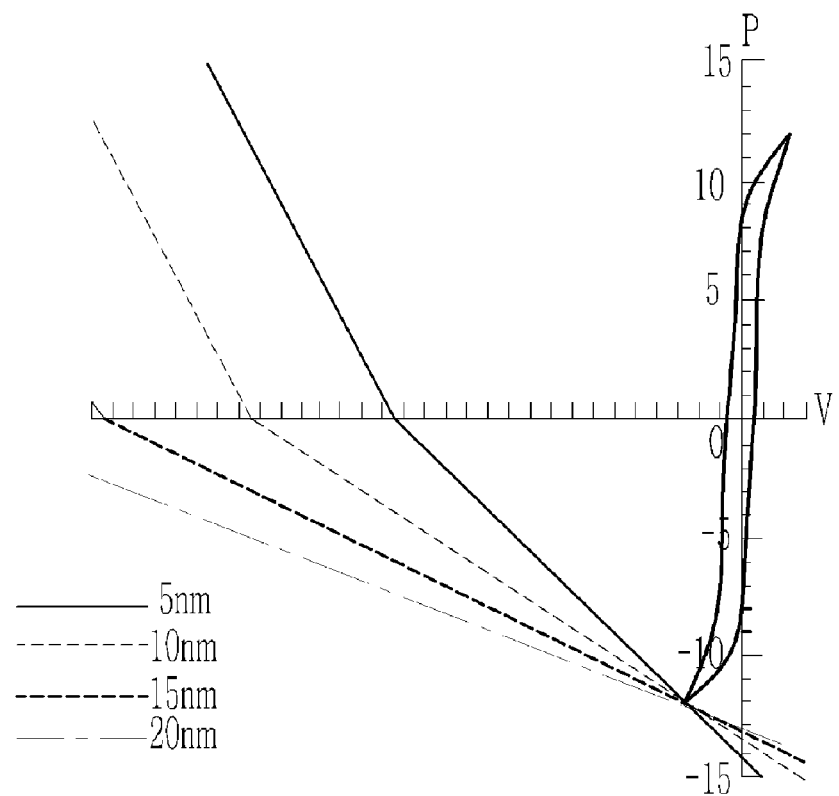
FIGS. 9A through 9C are graphs and a table showing relative operating voltages and depolarization fields of a transparent nonvolatile memory TFT according to the present invention, which are calculated by the analysis of a load line, with respect to a thickness of an oxide semiconductor thin layer.
Figure 9B:
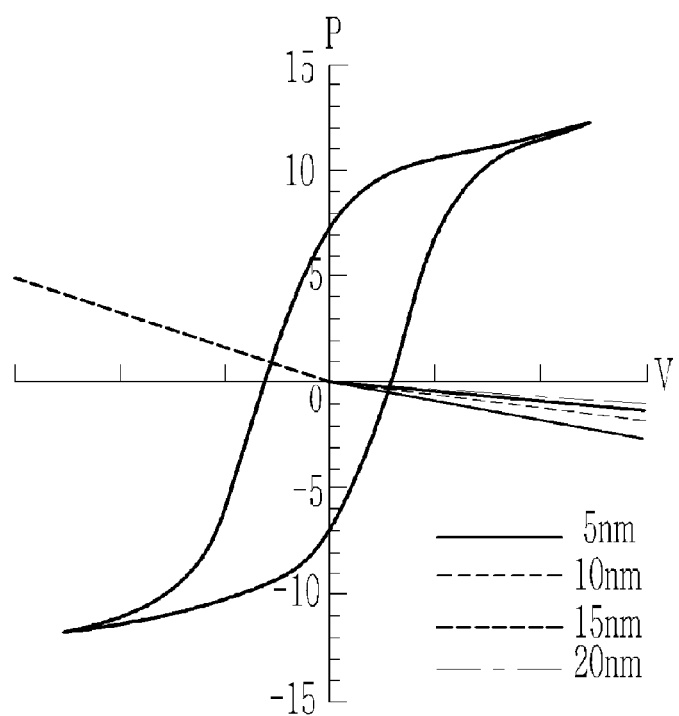
Figures 9C, 10A:
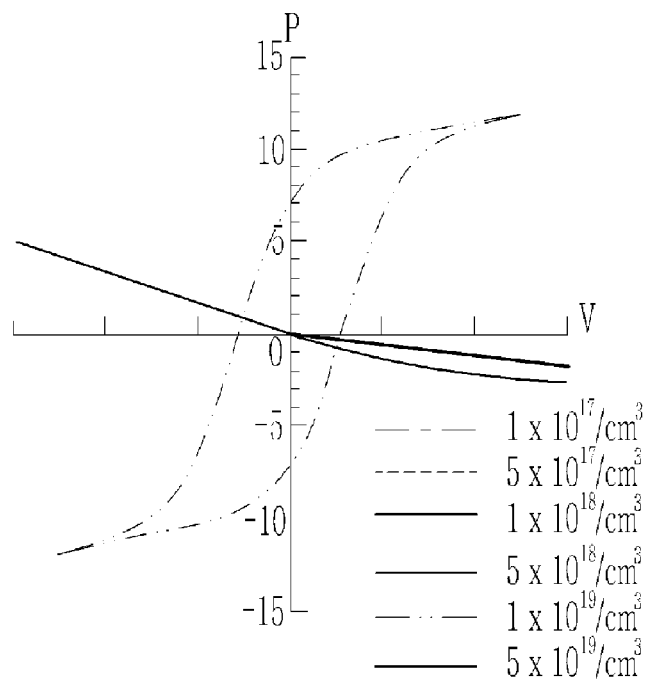
FIGS. 10A through 10C are graphs and a table showing relative off-operation depolarization fields of a transparent nonvolatile memory TFT according to the present invention, which are calculated by the analysis of a load line, with respect to a carrier concentration of an oxide semiconductor thin layer.

FIGS. 9A through 9C are graphs and a table showing relative operating voltages and depolarization fields of a transparent nonvolatile memory TFT according to the present invention, which are calculated by the analysis of a load line, with respect to a thickness of the oxide semiconductor thin layer.

Referring to FIGS. 9A and 9C, when the thickness of the oxide semiconductor thin layer 104 was changed, an off-operation voltage was indicated on the basis of the voltage VF applied to the ferroelectric capacitor. When the thickness of the oxide semiconductor thin layer 104 was changed to 5 nm, 10 nm, 15 nm, and 20 nm, a required operating voltage was changed to 6.6 VF, 9.4 VF, 12.2 VF, and 15.2 VF, respectively. That is, in order to reduce an off-operation voltage of the memory TFT according to the present invention, the thickness of the oxide semiconductor thin layer 104 needs to be as small as possible within such a range as not to damage operations of the memory TFT according to the present invention. However, although the oxide semiconductor thin layer 104 had a sufficiently small thickness of about 5 nm, a considerable operating voltage was still required. This result suggests that a variation in the thickness of the oxide semiconductor thin layer 104 should be made simultaneously with optimization of other conditions in order to sufficiently reduce the operating voltage of the memory TFT according to the present invention.

Referring to FIGS. 9B and 9C, when the thickness of the oxide semiconductor thin layer 104 was changed, an off-operation depolarization field was indicated on the basis of the coercive field EF applied to the ferroelectric capacitor. When the thickness of the oxide semiconductor thin layer 104 was changed to 5 nm, 10 nm, 15 nm, and 20 nm, an off-operation depolarization field was changed to 0.20 EF, 0.21 EF, 0.21 EF, and 0.21 EF, respectively. That is, it can be seen that the thickness of the oxide semiconductor thin layer 104 did not greatly affect the off-operation depolarization field.

In the current analysis of the load line, when the thickness of the oxide semiconductor thin layer 104 is changed, the off-operation voltage and the off-operation depolarization field were confirmed by calculation. However, it can be confirmed that an on-operation voltage and an on-operation depolarization field are independent of a variation in the thickness of the oxide semiconductor thin layer 104 because of the characteristics of the load line determined by the memory TFT according to the present invention. This is due to the fact that the depletion-layer capacitor including the oxide semiconductor thin layer 104 is formed only in the third applied voltage range (V<Vfd).

Figures 10B, 10C:
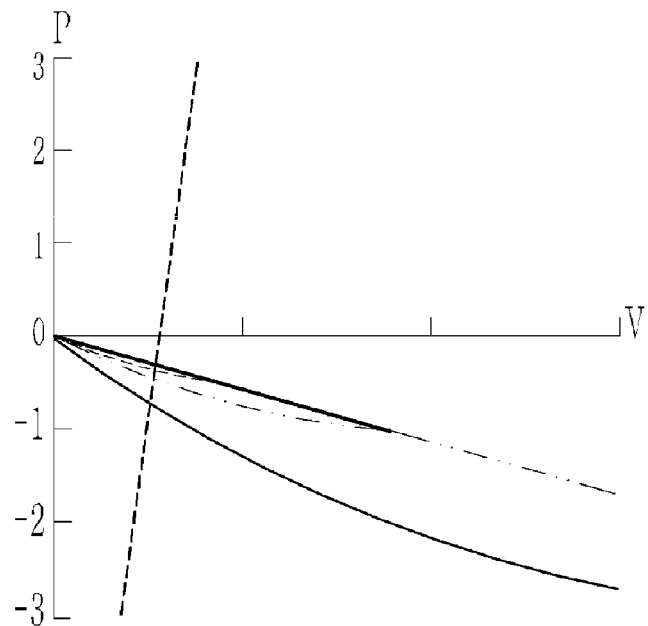

FIGS. 10A through 10C are graphs and a table showing relative off-operation depolarization fields of a transparent nonvolatile memory TFT according to the present invention, which are calculated by the analysis of a load line, with respect to a carrier concentration of the oxide semiconductor thin layer.

FIG. 10B is an enlarged view of a portion of FIG. 10A, which illustrates the influence of the carrier concentration of the oxide semiconductor thin layer 104 on an off-operation depolarization field of the memory TFT.

Referring to FIGS. 10A through 10C, when the carrier concentration of the oxide semiconductor thin layer 104 was changed, the off-operation depolarization field was indicated on the basis of the coercive field EF applied to the ferroelectric capacitor. When the carrier concentration was changed to $1\times10^{17}/cm^3$, $5\times10^{17}/cm^3$, $1\times10^{18}/cm^3$, $5\times10^{18}/cm^3$, $1\times10^{19}/cm^3$, and $5\times10^{19}/cm^3$, the off-operation depolarization field was changed to 0.22 EF, 0.22 EF, 0.22 EF, 0.21 EF, 0.21 EF, and 0.20 EF, respectively. That is, it can be seen that the carrier concentration of the oxide semiconductor thin layer 104 did not greatly affect the off-operation depolarization field.

Meanwhile, in the analysis of the load line shown in FIGS. 10A and 10B, only the influence of the carrier concentration of the oxide semiconductor thin layer 104 on the off-operation depolarization field was considered. However, since the carrier concentration of the oxide semiconductor thin layer 104 affects a curve forming the load line only in the second applied voltage range (Vfd<V<0), even if the entire oxide semiconductor thin layer 104 varies a threshold voltage at which complete depletion occurs, the oxide semiconductor thin layer 104 does not affect the slope of the load line. Accordingly, it can be inferred that on- or off-operation voltage characteristics do not reflect a variation in the carrier concentration of the oxide semiconductor thin layer 104.

As explained thus far, the influence of the physical properties and thicknesses of typical elements of the memory TFT according to the present invention on the behaviors of the operating voltage and depolarization field of the memory TFT according to the present invention was examined by analysis of the load line. As a result, the following principles that guide the design of the memory TFT according to the present invention may be achieved in order to enable low-voltage highly reliable operations.

First, the first and second auxiliary insulating layers 106 and 110 constituting the memory TFT according to the present invention need to be as thin as possible within such a range as not to decrease the advantages of the first and second auxiliary insulating layers 106 and 110. When the organic ferroelectric thin layer 108 is formed of P(VDF-TrFE) and the first and second auxiliary insulating layers 106 and 110 are formed of an ordinary insulating material having a relative permittivity of 10 or lower, the first and second auxiliary insulating layers 106 and 110 may be formed to a thickness of about 5 nm or less. Of course, according to the analysis of the load line, a further reduction in the thickness of the first and second auxiliary insulating layers 106 and 110 would be advantageous to a further drop in the operating voltage of the memory TFT according to the present invention. However, when the thickness of the first and second auxiliary insulating layers 106 and 110 is excessively reduced, the first and second auxiliary insulating layers 106 and 110 cannot sufficiently inhibit generation of a leakage current. In addition, it should be noted that the first and second auxiliary insulating layers 106 and 110 may suffer from a breakdown before a predetermined operating voltage is applied. On the other hand, when the sum of the thicknesses of the first and second auxiliary insulating layers 106 and 110 is 10 nm or more, an on-operation voltage is expected to greatly increase. Accordingly, the first and second auxiliary insulating layers 106 and 110 may be designed such that their total thickness ranges from about 3 nm to 10 nm. When the memory TFT includes both the first and second auxiliary insulating layers 106 and 110, the sum of the thicknesses of the first and second auxiliary insulating layers 106 and 110 may range from 3 nm to 10 nm. The first design principle may be provided to reduce the on-operation voltage of the memory TFT according to the present invention.

Second, the first and second auxiliary insulating layers 106 and 110 constituting the memory TFT according to the present invention need to be formed of a material having the highest possible relative permittivity within such a range as not to decrease the advantages of the first and second auxiliary insulating layers 106 and 110. When the organic ferroelectric thin layer 108 is formed of P(VDF-TrFE) and the first and second auxiliary insulating layers 106 and 110 are formed to a thickness of about 4 nm, the first and second auxiliary insulating layers 106 and 110 may be formed of a material having a relative permittivity of 20 or higher. In the analysis of the load line shown in FIG. 8, when the first and second auxiliary insulating layers 108 and 110 are formed of a high-k dielectric material having a relatively high relative permittivity, the on-operation voltage and the on-operation depolarization field may be greatly varied. Accordingly, the second design principle may be provided to reduce the on-operation voltage and on-operation depolarization field of the memory TFT, thereby improving a memory retention time.

Third, the oxide semiconductor thin layer 104 constituting the memory TFT according to the present invention needs to be as thin as possible within such a range as to enable the operation of the memory TFT. When the organic ferroelectric thin layer 108 is formed of P(VDF-TrFE) and the oxide semiconductor thin layer 104 is formed of an oxide semiconductor material having a permittivity of about 8, the oxide semiconductor thin layer 104 may be formed to a thickness of about 5 nm. Of course, according to the analysis of the load line, a further reduction in the thickness of the oxide semiconductor thin layer 104 would be advantageous to a further drop in the operating voltage of the memory TFT according to the present invention. However, it should be noted that an excessive reduction in the thickness of the oxide semiconductor thin layer 104 may hinder the operation of the memory TFT or lead to extreme degradation of the operating characteristics of the memory TFT. On the other hand, when the thickness of the oxide semiconductor thin layer 104 is 20 nm or more, an off-operation voltage is expected to greatly increase. Accordingly, the oxide semiconductor thin layer 104 may be designed such that its total thickness ranges from about 5 nm to 20 nm. The third design principle may be provided to reduce the off-operation voltage of the memory TFT according to the present invention.

Fourth, the carrier concentration of the oxide semiconductor thin layer 104 constituting of the memory TFT according to the present invention had a smaller influence on the operating characteristic of the device according to the present invention than expected. Thus, it is necessary to design the carrier concentration of the oxide semiconductor thin layer 104 so as to optimize the operating characteristics of the memory TFT without consideration of a memory operating characteristic.

Fifth, the characteristics of a material forming the organic ferroelectric thin layer 108 constituting the memory TFT according to the present invention need to be designed such that the organic ferroelectric thin layer 108 has as low a coercive field as possible. However, when the kind of a material of the organic ferroelectric thin layer 108 is determined, the fifth design principle may be automatically determined according to the physical properties of the material. Thus, the coercive field of the organic ferroelectric thin layer 108 cannot be simply changed to manufacture the device structure according to the present invention, so a detailed calculation thereof was not performed in the analysis of the load line. However, it was confirmed that the operating voltage of the memory TFT according to the present invention, which was obtained by changing other physical values in the analysis of the load line, was higher than an ordinary operating voltage of the device. This result implies that a dramatic reduction in the entire operating voltage of the memory TFT according to the present invention necessitates a variation in the characteristics of the organic ferroelectric thin layer 108, which is essential for a memory operation.

Sixth, it is required to reduce an on- or off-operation depolarization field in order to improve the operating reliability (i.e., memory retention characteristic) of the memory TFT according to the present invention. However, from the analysis of the load line, it can be seen that meaningfully changing a depolarization field is very difficult without largely changing the relative permittivity of the first and second auxiliary insulating layers 106 and 110 constituting the device structure according to the present invention. Accordingly, in order to improve the memory retention characteristic of the memory TFT according to the present invention, the device structure needs to be designed to perform a program operation using a saturation hysteresis curve of a ferroelectric capacitor instead of an unsaturated hysteresis curve of the ferroelectric capacitor. This is because it is known that the saturation hysteresis curve of the ferroelectric capacitor has a good tolerance to a depolarization field generated in a gate stack, while the unsaturated hysteresis curve of the ferroelectric capacitor lacks a tolerance to the depolarization field. However, since the sixth design principle contributes toward elevating the operating voltage of the memory TFT, it is necessary to design the structure and driving method of the memory TFT according to the present invention in consideration of a trade-off relationship between an operating voltage and operating reliability.

Figure 11A:
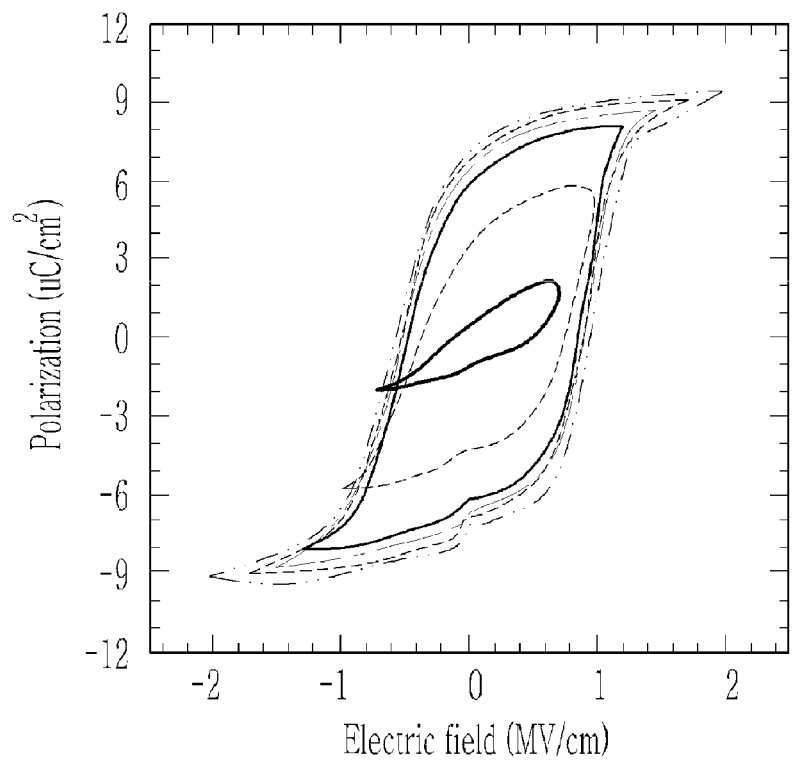
FIGS. 11A through 11C are P-V curves illustrating a case in which a gate stack of a memory TFT according to the present invention includes only an organic ferroelectric thin layer and a case in which the gate stack includes a stack structure of an auxiliary insulating layer and the organic ferroelectric thin layer.
Figure 11B:
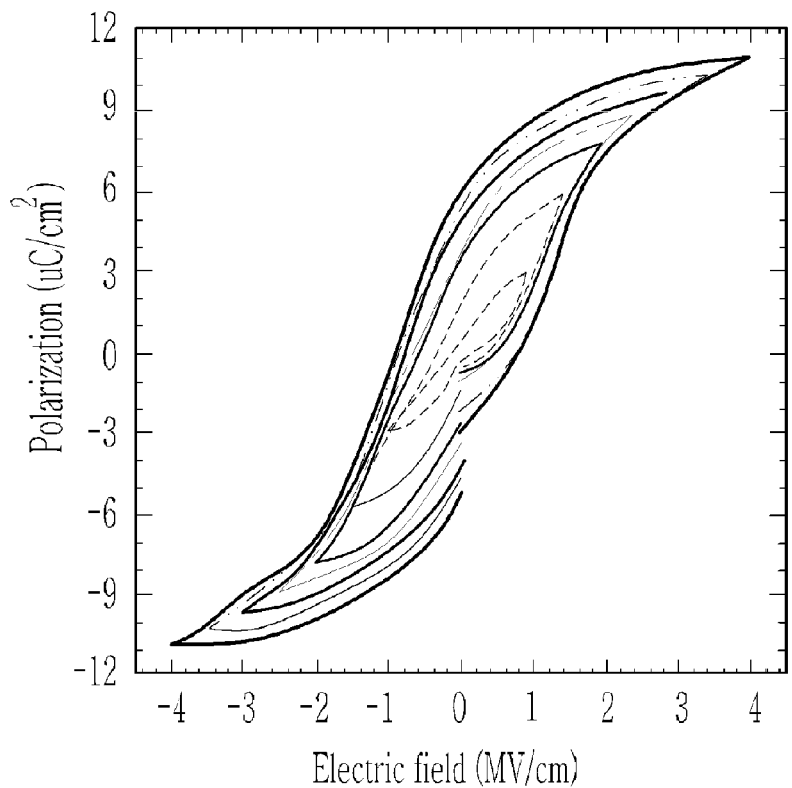
Figure 11C:
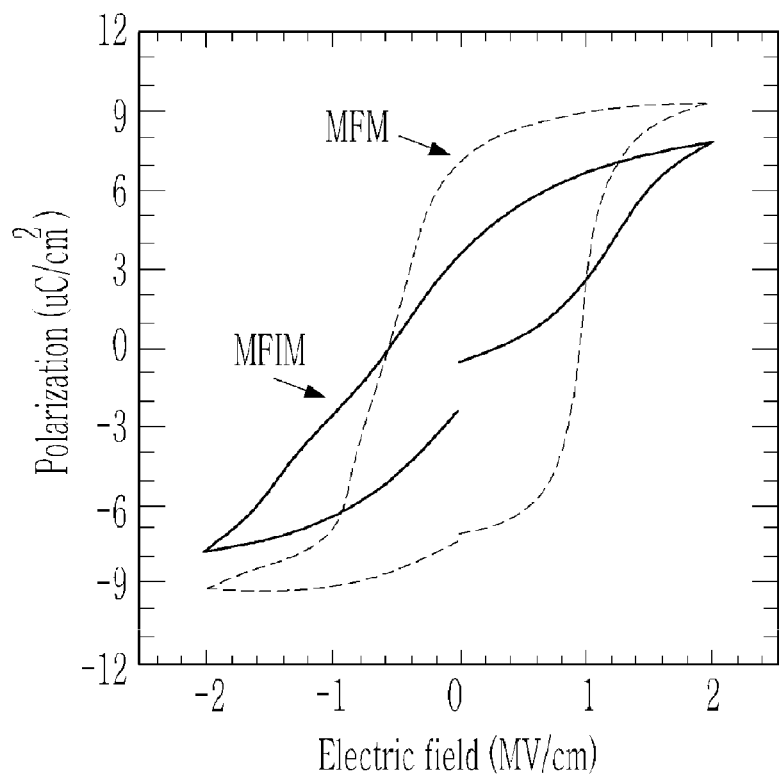

FIGS. 11A through 11C are P-V curves illustrating a case in which a gate stack of a memory TFT according to the present invention includes only an organic ferroelectric thin layer and a case in which the gate stack includes a stack structure of an auxiliary insulating layer and the organic ferroelectric thin layer.

Referring to FIG. 11A, in order to obtain a P-V curve, an organic ferroelectric thin layer was formed of P(VDF-TrFE) on an ITO lower electrode to a thickness of about 100 nm and crystallized at a temperature of about 140° C. Thereafter, an Al upper electrode was formed thereon to complete the manufacture of a ferroelectric capacitor, and a polarization hysteresis characteristic of the ferroelectric capacitor was measured.

Referring to FIG. 11B, in order to obtain a P-V curve, an auxiliary insulating layer was formed of $Al_2O_3$ on an ITO lower electrode to a thickness of about 5 nm using an atomic layer deposition (ALD) process. After that, an organic ferroelectric thin layer was formed of P(VDF-TrFE) to a thickness of about 100 nm and crystallized at a temperature of about 140° C. Thereafter, an Al upper electrode was formed thereon to complete the manufacture of a ferroelectric capacitor, and a polarization hysteresis characteristic of the ferroelectric capacitor was measured.

FIGS. 11A and 11B illustrate P-V characteristics of gate stack structures, which are slightly different from the gate stack of the transparent nonvolatile memory TFT according to the present invention. Thus, FIGS. 11A and 11B show how the characteristics of the ferroelectric capacitor including the organic ferroelectric thin layer are changed when the auxiliary insulating layer is inserted into the ferroelectric capacitor as proposed in the present invention. Although the two capacitors described with reference to FIGS. 11A and 11B exhibit about the same coercive field characteristics, it can be seen that a higher voltage should be applied to the ferroelectric capacitor including the stack structure of the organic ferroelectric thin layer and the auxiliary insulating layer in order to ensure about the same remnant polarization. This is because a part of the entire applied voltage is applied to the auxiliary insulating layer so that only the remaining voltage is applied to the ferroelectric capacitor according to the analysis of the load line.

FIG. 11C shows a comparison of polarization hysteresis curves of the two capacitors with application of the same voltage in order to make a clearer comparison between the characteristics of the two ferroelectric capacitors. As can be seen from FIG. 11C, the metal-ferroelectric-insulator-metal (MFIM) capacitor including the stack structure of the organic ferroelectric thin layer and the auxiliary insulating layer has merely an unsaturated hysteresis curve even at an operating voltage at which the MFM capacitor including only the organic ferroelectric thin layer has a saturation hysteresis curve.

Referring to FIGS. 11A through 11C, in order to manufacture the memory TFT according to the present invention, device parameters of elements of the memory TFT should be exactly understood, and the operating point of the memory TFT should be comprehended by analysis of load lines so as to strictly achieve a method of reducing the operating voltage of the memory TFT.

Figure 12:
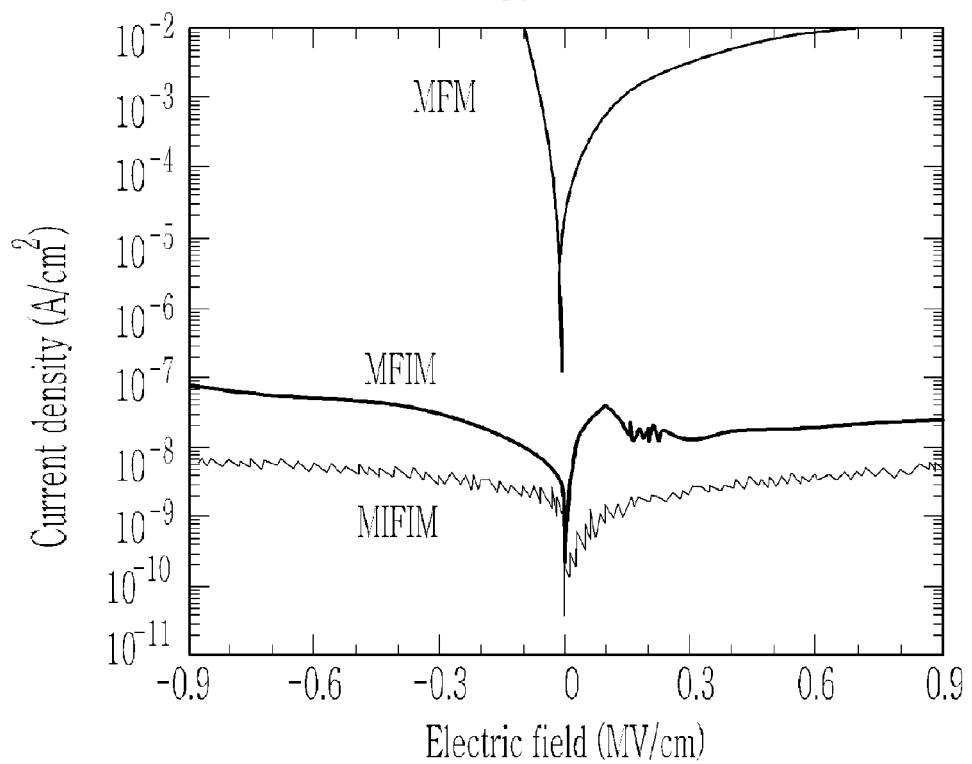
FIG. 12 is a graph showing leakage current characteristics of a ferroelectric capacitor of a memory TFT according to the present invention in a ferroelectric capacitor including only an organic ferroelectric thin layer, a ferroelectric capacitor including a first auxiliary insulating layer and the organic ferroelectric thin layer, and a ferroelectric capacitor including both first and second auxiliary insulating layers disposed on the organic ferroelectric thin layer.

FIG. 12 is a graph showing leakage current characteristics of three kinds of ferroelectric capacitors, that is, an MFM capacitor including only an organic ferroelectric thin layer, an MFIM capacitor with a stack structure of a first auxiliary insulating layer and an organic ferroelectric thin layer, a metal-insulator-ferroelectric-insulator-metal (MIFIM) capacitor with a stack structure including first and second auxiliary insulating layers disposed on an organic ferroelectric thin layer according to the present invention.

Referring to FIG. 12, the leakage current characteristics of each of the three capacitors are provided in order to confirm the effects of a memory TFT including the first and second auxiliary insulating layers according to the present invention by investigating an increase in the operating voltage of the memory TFT. Meanwhile, in order to further heighten a leakage current reduction effect among the effects of an auxiliary insulating layer, the organic ferroelectric thin layer was formed of P(VDF-TrFE) to a thickness of about 50 nm. In addition, the three capacitors were manufactured using the same materials under the same conditions as described with reference to FIGS. 11A through 11C, except for the thickness of the organic ferroelectric thin layer.

Referring to FIG. 12, it can be observed that the MFM capacitor exhibits a very high leakage current characteristic, while the MFIM capacitor has a far smaller leakage current than the MFM capacitor. Also, it can be seen that the MIFIM capacitor has a smaller leakage current than the MFIM capacitor. From this result, it can be confirmed that the structure of the memory TFT according to the present invention can markedly enhance the electrical characteristics of the gate stack.

Figure 13:
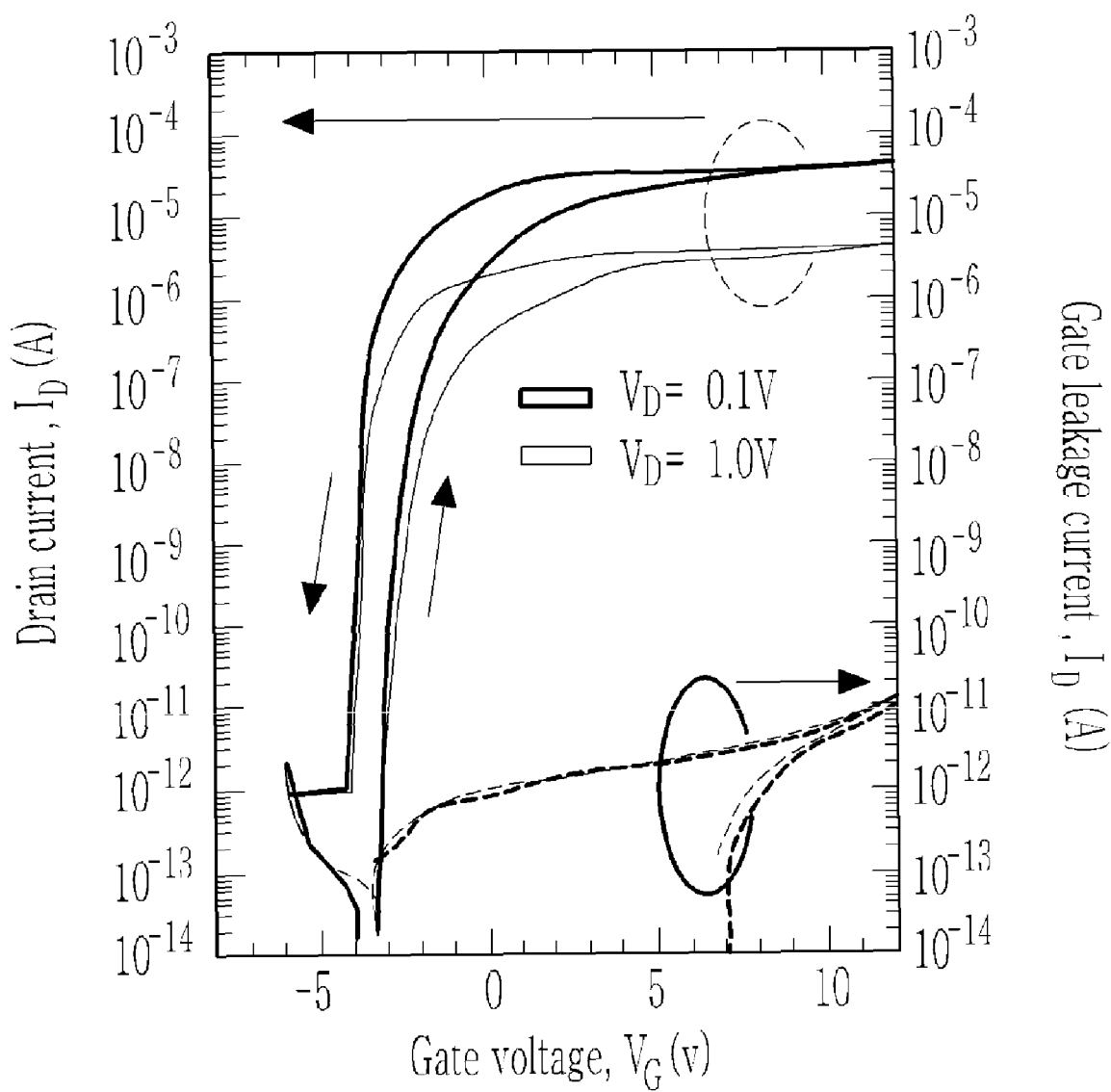
FIG. 13 is a graph showing gate voltage-drain current characteristics of a memory TFT according to an exemplary embodiment of the present invention.

FIG. 13 is a graph showing gate voltage-drain current characteristics of a memory TFT according to an exemplary embodiment of the present invention.

Referring to FIG. 13, a memory TFT according to an exemplary embodiment of the present invention was manufactured using the method described with reference to FIGS. 2A through 2I except for a process of forming a gate electrode using a transparent conductive oxide. The memory TFT of FIG. 13 employs an ordinary Al gate electrode, which is sufficient to show that the memory TFT according to the present exemplary embodiment may ensure operating characteristics. In order to manufacture the memory TFT, an organic ferroelectric thin layer was formed of P(VDF-TrFE) to a thickness of about 100 nm, an auxiliary insulating layer was formed of $Al_2O_3$ to a thickness of about 9 nm, and an oxide semiconductor thin layer was formed of zinc-tin oxide (Zn—Sn—O) doped with aluminum (Al) and indium (In) to a thickness of about 25 nm.

Referring to FIG. 13, it can be observed that a hysteresis characteristic of a drain current relative to a variation in threshold voltage was obtained with application of a gate voltage. When a program voltage of about −5 V to 15 V was applied, a variation in the threshold voltage was about 1V. That is, the threshold voltage of the memory TFT was varied due to remnant polarization characteristics of the organic ferroelectric thin layer. This characteristic may be regarded as a memory operation characteristic of the memory TFT according to an exemplary embodiment of the present invention. Meanwhile, it can be expected that the memory operation characteristic and the transistor operation characteristic of the memory TFT may be further improved by optimizing the structure of the memory TFT on the design principles proposed by the present invention.

Meanwhile, the above-described structure, material combinations, and device manufacturing methods of the transparent nonvolatile TFT according to the present invention may be partially changed in order to enhance the characteristics of the memory TFT. The present invention is not limited to the device structure shown in FIG. 1 and the method described with reference to FIGS. 2A through 2I, and the memory TFT according to the present invention may be manufactured in various different forms. That is, it will be understood that the above-described structure of the transparent nonvolatile TFT and method of manufacturing the same are a typical device structure and method to effectively provide a detailed description of the transparent nonvolatile TFT according to the present invention.

As described above, the present invention provides a transparent nonvolatile memory TFT using an organic ferroelectric thin layer and an oxide semiconductor thin layer. Also, auxiliary insulating layers are formed above and below the organic ferroelectric thin layer. As a result, the transparent nonvolatile memory TFT according to the present invention can be manufactured using a low-temperature process at a low cost. Furthermore, the present invention provides methods of optimizing the physical properties and thicknesses of the auxiliary insulating layers and the oxide semiconductor thin layer, thereby reducing an operating voltage and improving operating reliability.

In the drawings and specification, there have been disclosed typical exemplary embodiments of the invention and, although specific terms are employed, they are used in a generic and descriptive sense only and not for purposes of limitation. As for the scope of the invention, it is to be set forth in the following claims. Therefore, it will be understood by those of ordinary skill in the art that various changes in form and details may be made therein without departing from the spirit and scope of the present invention as defined by the following claims.

What is claimed is:

1. A transparent nonvolatile memory thin film transistor (TFT) comprising:
    source and drain electrodes disposed over a transparent substrate;
    a transparent semiconductor thin layer disposed over the transparent substrate between the source and drain electrodes;
    an organic ferroelectric thin layer disposed over the transparent semiconductor thin layer;
    a gate electrode disposed over the organic ferroelectric thin layer;
    a first auxiliary insulating layer disposed between the transparent semiconductor thin layer and the organic ferroelectric thin layer; and
    a second auxiliary insulating layer disposed over the organic ferroelectric thin layer.

2. The memory TFT according to claim 1, wherein the source and drain electrodes are formed of a transparent conductive oxide.

3. The memory TFT according to claim 1, wherein the transparent semiconductor thin layer is a transparent oxide semiconductor thin layer.

4. The memory TFT according to claim 3, wherein the oxide semiconductor thin layer is formed of at least two selected from the group consisting of zinc oxide (ZnO), indium-gallium-zinc oxide (In—Ga—Zn—O), zinc-tin oxide (Zn—Sn—O), and an oxide containing at least two selected from the group consisting of zinc (Zn), indium (In), gallium (Ga), tin (Sn), and aluminum (Al).

5. The memory TFT according to claim 1, wherein the organic ferroelectric thin layer is formed of a copolymer of poly(vinylidene fluoride-trifluorotethylene) (P(VDF-TrFE)).

6. The memory TFT according to claim 1, wherein the organic ferroelectric thin layer includes a via hole exposing the source and drain electrodes,
    the TFT further comprising a pad disposed over the organic ferroelectric thin layer to fill the via hole.

7. The memory TFT according to claim 1, wherein the first auxiliary insulating layer or the second auxiliary insulating layer is one selected from the group consisting of a silicon-based insulating layer, a metal oxide layer, and a silicate insulating layer formed of a metal element constituting the metal oxide layer and silicon,
    wherein the silicon-based insulating layer is one selected from the group consisting of a silicon oxide ($SiO_2$) layer, a silicon nitride (SiN) layer, and a silicon oxynitride (SiON) layer, and the metal oxide layer is one selected from the group consisting of an aluminum oxide ($Al_2O_3$) layer, a hafnium oxide ($HfO_2$) layer, a zirconium oxide ($ZrO_2$) layer, a magnesium oxide (MgO) layer, a titanium oxide ($TiO_2$) layer, a tantalum oxide ($Ta_2O_5$) layer, a lanthanum oxide ($La_2O_3$) layer, and a strontium-titanium oxide ($SrTiO_3$) layer.

* * * * *